(12) United States Patent
Gopalakrishnan et al.

(10) Patent No.: US 12,346,567 B2
(45) Date of Patent: Jul. 1, 2025

(54) PARTIAL ARRAY REFRESH TIMING

(71) Applicant: Rambus Inc., San Jose, CA (US)

(72) Inventors: Liji Gopalakrishnan, Sunnyvale, CA (US); Thomas Vogelsang, Mountain View, CA (US); John Eric Linstadt, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 18/519,359

(22) Filed: Nov. 27, 2023

(65) Prior Publication Data

US 2024/0176497 A1    May 30, 2024

Related U.S. Application Data

(63) Continuation of application No. 17/785,269, filed as application No. PCT/US2020/063135 on Dec. 3, 2020, now Pat. No. 11,868,619.

(60) Provisional application No. 62/951,953, filed on Dec. 20, 2019.

(51) Int. Cl.
| | |
|---|---|
| *G06F 3/06* | (2006.01) |
| *G11C 11/406* | (2006.01) |
| *G06F 13/16* | (2006.01) |

(52) U.S. Cl.
CPC .......... *G06F 3/0613* (2013.01); *G06F 3/0659* (2013.01); *G06F 3/0673* (2013.01); *G11C 11/40622* (2013.01); *G06F 13/1636* (2013.01)

(58) Field of Classification Search
CPC .... G06F 3/0613; G06F 3/0659; G06F 3/0673; G06F 13/1636; G11C 11/40622

USPC ................................................. 711/106, 154
See application file for complete search history.

(56) References Cited

U.S. PATENT DOCUMENTS

| | | | |
|---|---|---|---|
| 5,335,201 | A | 8/1994 | Walther et al. |
| 5,566,119 | A | 10/1996 | Matano |
| 5,634,106 | A | 5/1997 | Yaezawa et al. |
| 5,761,703 | A | 6/1998 | Bolyn |

(Continued)

OTHER PUBLICATIONS

Cui, Zehan et al., "DTail: A Flexible Approach to DRAM Refresh Management", In: Proceedings of the 28th ACM International Conference on Supercomputing, Jun. 13, 2014, Retrieved on Jan. 18, 2021 from: <http://publications.lib.chalmers.se/records/fulltext/200675/local_200675.pdf>, entire document. 10 pages.

(Continued)

*Primary Examiner* — Than Nguyen
(74) *Attorney, Agent, or Firm* — The Neudeck Law Firm, LLC

(57) ABSTRACT

A memory controller combines information about which memory component segments are not being refreshed with the information about which rows are going to be refreshed next, to determine, for the current refresh command, the total number of rows that are going to be refreshed. Based on this total number of rows, the memory controller selects how long to wait after the refresh command before issuing a next subsequent command. When the combination of masked segments and the refresh scheme results in less than the 'nominal' number of rows typically refreshed in response to a single refresh command, the waiting period before the next command (e.g., non-refresh command) is issued may be reduced from the 'nominal' minimum time period, thereby allowing the next command to be issued earlier.

20 Claims, 16 Drawing Sheets

(56) References Cited

U.S. PATENT DOCUMENTS

| | | |
|---|---|---|
| 6,834,022 B2 | 12/2004 | Derer et al. |
| 9,165,635 B2 | 10/2015 | Wang et al. |
| 9,418,723 B2 | 8/2016 | Chishti et al. |
| 10,115,448 B2 | 10/2018 | Lee et al. |
| 10,332,582 B2 | 6/2019 | Suh et al. |
| 10,741,235 B2 * | 8/2020 | Nakamura .......... G11C 11/4087 |
| 2005/0088896 A1 | 4/2005 | Yeh |
| 2005/0108460 A1 | 5/2005 | David |
| 2006/0004955 A1 | 1/2006 | Ware et al. |
| 2008/0027703 A1 | 1/2008 | Rajan et al. |
| 2011/0252193 A1 | 10/2011 | Bains et al. |
| 2012/0026813 A1 * | 2/2012 | Sato ...................... G11C 11/406 365/194 |
| 2013/0100755 A1 | 4/2013 | Youn et al. |
| 2014/0293725 A1 | 10/2014 | Best et al. |
| 2015/0026399 A1 | 1/2015 | Coquelin et al. |
| 2015/0325166 A1 | 11/2015 | Lee et al. |
| 2016/0027498 A1 | 1/2016 | Ware et al. |
| 2018/0061484 A1 | 3/2018 | Biswas |
| 2019/0043558 A1 * | 2/2019 | Suh ....................... G11C 7/1006 |
| 2019/0074051 A1 * | 3/2019 | Chang ............... G11C 11/40622 |
| 2019/0221252 A1 | 7/2019 | Suh et al. |
| 2019/0243721 A1 | 8/2019 | Fox et al. |

OTHER PUBLICATIONS

Notification of Transmittal of the International Search Report and the Written Opinion of the International Searching Authority, or the Declaration with Mail Date Feb. 10, 2021 re: Int'l Appln. No. PCT/US2020/063135. 11 pages.

EP Response filed Jun. 17, 2024 in Response to the Extended European Search Report Dated Dec. 22, 2023 and the Communication Pursuant to Rules 70(2) and 70a(2) EPC Dated Jan. 9, 2024 re: EP Appln. No. 20901978.5. 29 pages.

EP Extended European Search Report with Mail Date Dec. 22, 2023 re: EP Appln. No. 20901978.5. 10 pages.

* cited by examiner

PARTIAL ARRAY REFRESH TIMING

DETAILED DESCRIPTION OF THE EMBODIMENTS

In order to maintain information reliably, Dynamic Random Access Memory (DRAM) device standards specify a fixed number of refresh commands that must occur over a fixed time period. As DRAM capacities have increased from generation to generation, however, these fixed numbers have remained essentially constant. Thus, rather than refreshing a single row in response to each refresh command, DRAM devices refresh multiple (e.g., 8) rows in response to a single received refresh command. In addition, some DRAM devices have power saving modes whereby entire memory ranges (i.e., segments) are not refreshed thereby saving the power that would have been spent refreshing those memory ranges.

In an embodiment, a memory controller monitors writes to the memory component's power saving mode (i.e., segment masking) register to determine which segments are not being refreshed by the memory component. The memory controller is also provided with information about the multi-row refresh scheme being implemented by a memory component. The refresh scheme information is used to determine which segments contain rows that are to be refreshed when the next refresh command is issued. Because one or more rows that are scheduled to be refreshed may lie within a segment that is not going to be refreshed because the segment is masked, the total number of rows refreshed by the memory component in response to a single refresh command may vary from a maximum number (i.e., nominal when no segments are masked—e.g., 8) to zero.

In an embodiment, the memory controller combines information about which segments are not being refreshed with the information about which rows are going to be refreshed next, to determine, for the current refresh command, the total number of rows that are going to be refreshed. Based on this total number of rows, the memory controller selects how long to wait after the refresh command before issuing a next subsequent command. Thus, when the combination of masked segments and the row refresh sequence (or scheme) results in less than the 'nominal' number of rows typically refreshed in response to a single refresh command, the waiting period before the next command (e.g., non-refresh command) is issued may be reduced from the 'nominal' minimum time period—thereby allowing the next command to be issued earlier.

Figure 1:
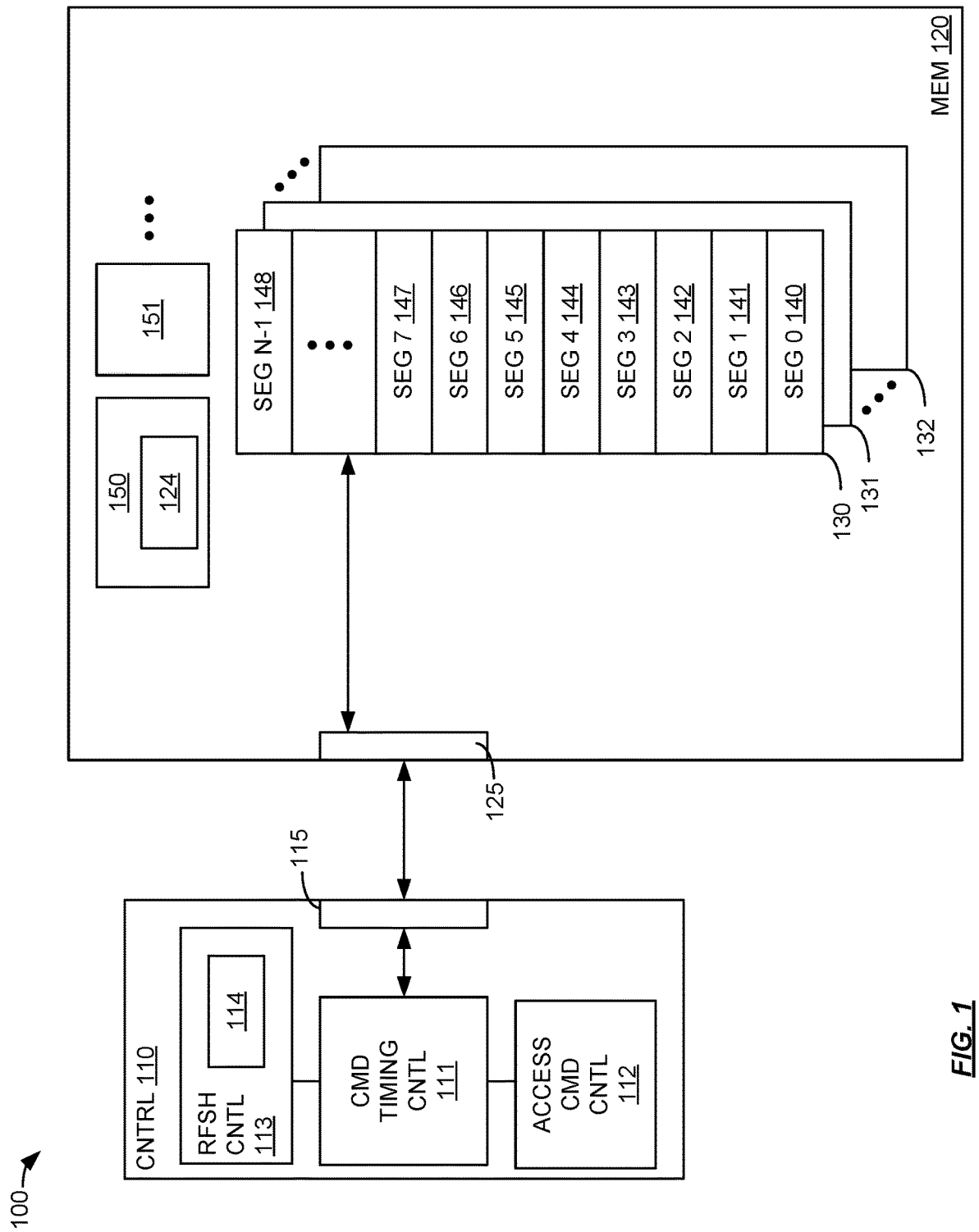
FIG. 1 is a block diagram of a memory system.

FIG. 1 is a block diagram of a memory system. In FIG. 1, memory system 100 comprises controller 110 and memory component 120. Memory component 120 includes P number of memory banks 130-132 to provide a specified memory space (or capacity), where P may be any integer greater than zero. The rows of memory cells in each memory bank 130-132 may be further partitioned into ranges of rows known as segments. In FIG. 1, memory banks 130-132 are illustrated as being partitioned into N number of segments, where N is an integer greater than zero. In particular, memory bank 130 is illustrated as being partitioned into segment 0 140, segment 1 141, segment 2 142, segment 3 143, segment 4 144, segment 5 145, segment 6 146, segment 7 147, a plurality of segments that are not illustrated in FIG. 2 for the sake of brevity, and, segment N-1 148. Memory component 120 also includes mode circuitry 150, partial array refresh control circuitry 151, and interface 125. Mode circuitry includes refresh mask register 124. Controller 110 includes command timing control 111, access command control 112, refresh control 113, and interface 115. Refresh control 113 includes shadow refresh mask register 114.

Controller 110 and memory component 120 may be integrated circuit type devices, such as are commonly referred to as a "chips". A memory controller, such as controller 110, manages the flow of data going to and from memory devices and/or memory modules. Memory component 120 may be a standalone device, a stacked die device, or may include a number of dies or stacked dies disposed on a memory module. Memory component 120 may be co-packaged with a controller die using wire-bonds or through silicon vias (TSV). A memory controller can be a separate, standalone chip, or integrated into another chip. For example, a memory controller may be included on a single die with a microprocessor, or included as part of a more complex integrated circuit system such as a block of a system on a chip (SOC).

Controller 110 is operatively coupled to memory component 120 via at least one command address interface. Controller 110 is operatively coupled to memory component 120 to send commands to memory component 120. Memory component 120 receives the commands (and addresses) via a corresponding command address interface.

In an embodiment, memory component 120 may be configured to skip refresh operations for one or more segments 140-148. In an embodiment, memory component 120 may be configured to skip refresh operations for one or more memory banks 130-132. This skipping of refresh operations is also known as partial array refresh (PAR). Partial array refresh may include partial array auto refresh (PAAR). This skipping of refresh operations saves power by disabling at least a portion of the full capacity of memory component 120.

Memory component 120 may be configured to skip refresh operations for one or more segments 140-148 and/or memory banks 130-132 by setting values in refresh mask register 124. For example, memory component 120 may be configured by controller 110 to skip refresh operations for segment 0 140 by setting a corresponding bit in refresh mask register 124 to a value that indicates to memory component 120 that refresh operations should not be performed on segment 0 140.

To set or unset bits (i.e., refresh masking indicators) in refresh mask register 124, controller 110 may issue mode-register write (MRW) commands to memory component 120. In an embodiment, when controller issues a MRW command to write a value into refresh mask register 124, controller 110 writes a corresponding value into shadow refresh mask register 114. This allows controller 110 to read shadow refresh mask register 114 in order to determine which, and how many, segments 140-148 are refreshed by a particular refresh command. In another embodiment, controller 110 may read refresh mask register 124 to determine which, and how many, segments are refreshed by a particular refresh command. Controller 110 may write the value read from refresh mask register 124 into shadow refresh mask register 114.

It should be understood that a plurality of refresh mask registers 124 may be included in mode circuitry 150. However, for the sake of brevity, FIG. 1 illustrates a single refresh mask register 124. Likewise, it should be understood that corresponding plurality of shadow refresh mask registers 114 may be included in refresh control 113. However, for the sake of brevity, FIG. 1 illustrates a single shadow refresh mask register 114.

Different one or more refresh mask registers may be used to implement refresh mask register 124. Refresh mask register 124 may include a plurality of segment mask bits, a plurality of bank mask bits, or both. For each refresh mask register 124 implemented, controller 110 may issue MRW commands along with corresponding values to be written. Likewise, for each shadow refresh mask register 114 implemented, controller 110 may write corresponding values in order to track which segments 140-148 and/or memory banks 130-132 will perform refresh operations.

In an embodiment, memory component 120 refreshes multiple rows in a given memory bank 130-132 in response to receiving a refresh command from controller 110. For example, in order to reliably retain data, the specifications of memory component 120 may require memory component 120 receive 8,192 refresh commands every 64 ms—which translates to averaging one refresh command every 7.8 µs. However, memory component 120 may have, for example, 32,768 rows per memory bank 130-132. Thus, in this example, memory component 120 would necessarily need to refresh four (4) rows in response to each refresh command. Correspondingly, in this example, controller 110 issues 8,192 refresh commands every 64 ms in order to maintain the information stored in memory component 120. This number of issued refresh commands per time interval by controller 110 may be constant regardless of whether one or more segments 140-148 is masked from being refreshed. Controller 110 also necessarily needs to wait a specified amount of time after issuing a refresh command to allow all four (4) of the row refresh operations to complete before issuing another command (e.g., an access command such as a read, write, activate, etc.) to memory component 120. This specified amount of time is commonly known as refresh cycle time—$t_{RFC}$.

In an embodiment, memory component 120 completes a multiple row refresh operation in less time when fewer than the maximum number (or nominal) number of rows are refreshed in response to a single refresh command. In other words, when the skipping of refresh operations on a segment 140-148 results in one or more rows scheduled to be refreshed not being refreshed, memory component 120 completes the refresh operations is less time than would have been required to refresh the nominal (normal) number of rows that would have been refreshed without refresh masking. Thus, using the previous example, when one (or more) of the four (4) rows scheduled to be refreshed is masked from being refreshed (e.g., by refresh mask register 124), memory component 120's $t_{RFC}$ time requirement is reduced (or eliminated) because memory component 120 is able to perform fewer row refresh operations in less time than completing all four (4) refresh operations.

In an embodiment, memory component 120's $t_{RFC}$ requirement has a linear relationship to the number of rows refreshed. This linear relationship may include some fixed time overhead. Thus, an example equation for calculating $t_{RFC}$ may be as follows:

$$t_{RFC} = R \times t_{row} + t_{fixed}$$

where R is the number of rows to be refreshed, $t_{row}$ is the time to refresh a single row, and $t_{fixed}$ is a fixed time related to overhead operations (e.g., command decoding, etc.) Thus, for example, if memory component 120's $t_{RFC}$ is 180 ns to refresh four rows (e.g., R=4, $t_{row}$=40 ns, $t_{fixed}$=20 ns) memory component 120 may only require a $t_{RFC}$=3×40+20=140 ns when the refreshing of one row is skipped due to a refresh masking value in refresh masking register 124. In an embodiment, $t_{fixed}$ may be zero.

In an embodiment, controller 110 maintains shadow refresh mask register 114 in order to determine the number of rows that memory component 120 will refresh in response to a given refresh command. Controller 110 may also maintain shadow refresh counters and memory component 120 configuration information to determine which rows are going to be refreshed in response to a refresh command. Controller 110 may use the information about which rows are going to be refreshed to determine the number of rows that are to be refreshed.

In an embodiment, controller 110 may read refresh mask register 124 and/or refresh counters from memory component 120 in order to determine the number of rows that memory component 120 will refresh in response to a given refresh command. Controller 110 may read refresh mask register 124, refresh counters, and/or memory component 120 configuration information to determine which rows are going to be refreshed in response to a refresh command. Controller 110 may use the information about which rows are going to be refreshed to determine the number of rows that are to be refreshed.

Controller 110 may be configured (e.g., by a host processor) with the information about which rows (e.g., row refresh pattern) memory component 120 is refreshing. Controller 110 (or a host processor) may receive this information from memory component 120 (e.g., via mode register read, serial presence detect, etc.), or from a dedicated serial presence detect device (e.g., a non-volatile memory device) disposed on a memory module that includes memory component 120.

In an embodiment, controller 110 calculates the number of rows that are going to be refreshed in response to a refresh command that controller 110 has issued or will issue. Based at least on the number of rows that are going to be refreshed, refresh control 113 calculates a $t_{RFC}$ for that refresh command. An indicator of the $t_{RFC}$ for the refresh command is communicated with command timing control. Command timing control 111 schedules and issues the refresh command. Based on the indicator of the $t_{RFC}$ for the refresh command, command timing control 111 determines a time interval between the transmission of the refresh command and the transmission of the next subsequent command (e.g., an access command received from access command control 112.)

In an embodiment, controller 110 transmits refresh commands to memory component 120 via a command interface that is a part of interface 115. Memory component 120 receives these refresh commands via a corresponding command interface that is a part of interface 125. In response to a single refresh command, memory component 120 may refresh one or more rows as determined by the row refresh scheme (i.e., the distribution of the rows scheduled to be refreshed among segments 140-148 and the progression of those rows from refresh command to refresh command) and the contents of refresh mask register 124. After transmitting a refresh command, command timing control 111 waits for memory component 120 to complete the refresh operations before sending another command (e.g., from access command control 112.) The amount of time command timing control 111 waits is based on the number of rows memory component 120 refreshes in response to the refresh command. Refresh control 113 determines the amount of time command timing control 111 should wait based on the refresh scheme and the contents of shadow refresh mask register 114.

In an embodiment, refresh control 113 may use a lookup table that is indexed by the number of rows scheduled to be refreshed to select the amount of time controller 110 is to wait before issuing the next command subsequent to the refresh command. This lookup table may be programmed by a host and/or received from memory component 120. Because the number of rows scheduled to be refreshed may vary from refresh command to refresh command, the wait times after refresh commands may also vary from refresh command to refresh command. Also, as the contents of shadow refresh mask register 114 are changed from time to time, the number of rows scheduled to be refreshed in response to a refresh command targeting a given set of segments may change as a result.

In an embodiment, controller 110 transmits commands to memory component 120 via a command interface that is a part of interface 115. These commands may include commands that write values to refresh mask register 124. Different values in refresh mask register 124 place memory component 120 in different partial array refresh modes. These modes may include refreshing all segments 140-148 and/or refreshing less than all of segments 140-148. Controller 110 also transmits periodic refresh commands generated by refresh control 113. In between refresh commands, controller 110 may transmit memory access commands generated by access command control 112. The time interval after a refresh command to the next subsequent memory access command may be based on the contents of shadow refresh mask register 114 and information controller 110 receives about the multiple row refresh scheme used by memory component 120.

Figure 2A:
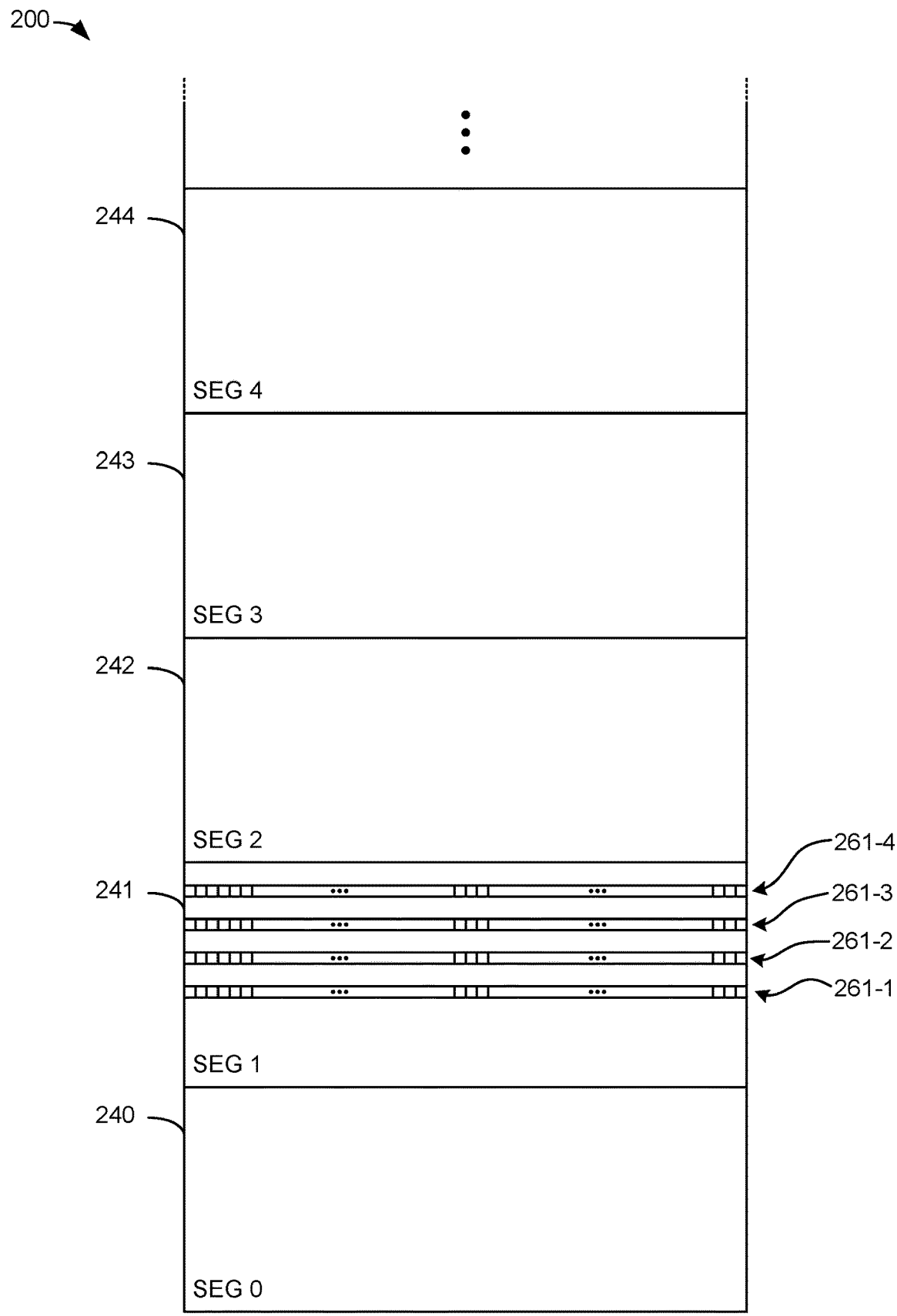
FIGS. 2A-2G illustrate multiple row refresh schemes.

FIGS. 2A-2G illustrate multiple row refresh schemes. In FIGS. 2A-2G, memory bank 200 is illustrated. Memory bank 200 is illustrated as including segment 0 240, segment 1 241, segment 2 242, segment 3 243, segment 4 244, and so on. FIG. 2A illustrates an example multiple row refresh scheme where all of the refreshed rows are within the same segment. In FIG. 2A, four rows 261-1 to 261-4 are scheduled to be refreshed. Rows 261-1 to 261-4 all lie within segment 241. Segment 241 is not refresh masked (e.g., by refresh mask register 124.) Thus, when receiving a refresh command when rows 261-1 to 261-4 are scheduled to be refreshed, the memory component with memory bank 200 would require the nominal (i.e., full) $t_{RFC}$ amount of time before receiving a next subsequent command. Likewise, the controller issuing the refresh command would wait the nominal (i.e., full) $t_{RFC}$ amount of time before transmitting a next subsequent command.

Figure 2B:
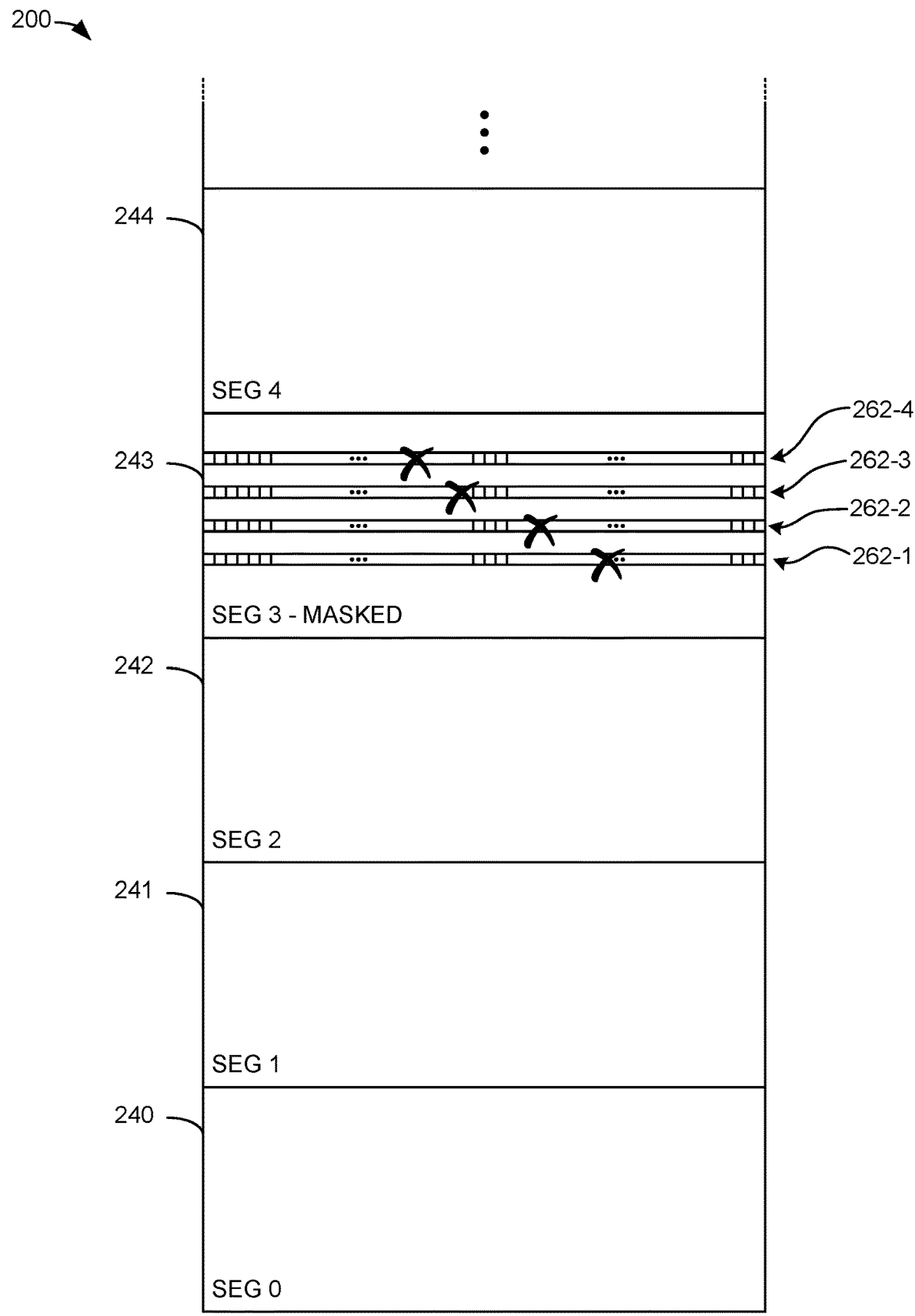

FIG. 2B illustrates the example multiple row refresh scheme of FIG. 2A (with all of the refreshed rows being within the same segment) that targets rows in a masked segment. In FIG. 2B, four rows 262-1 to 262-4 are scheduled to be refreshed. Rows 262-1 to 262-4 all lie within segment 243. Segment 243 is refresh masked (e.g., by refresh mask register 124.) Thus, none of rows 262-1 to 264-4 are to be refreshed. This is illustrated in FIG. 2B by the X's over rows 262-1 to 264-4. Accordingly, when receiving a refresh command when rows 262-1 to 262-4 are scheduled to be refreshed, the memory component with memory bank 200 would require only the overhead ($t_{fixed}$) amount of time before receiving a next subsequent command. Likewise, the controller issuing the refresh command may only wait the minimum ($t_{fixed}$) amount of time before transmitting a next subsequent command. In an embodiment, the controller may determine that, due to the refresh masking configuration of the memory component, that no rows will be refreshed in response to the refresh command. In this case, the controller may elect not to issue the refresh command. If the controller does not issue the refresh command, the controller may issue a command or take another action to advance one or more refresh counters in the memory component.

Figure 2C:
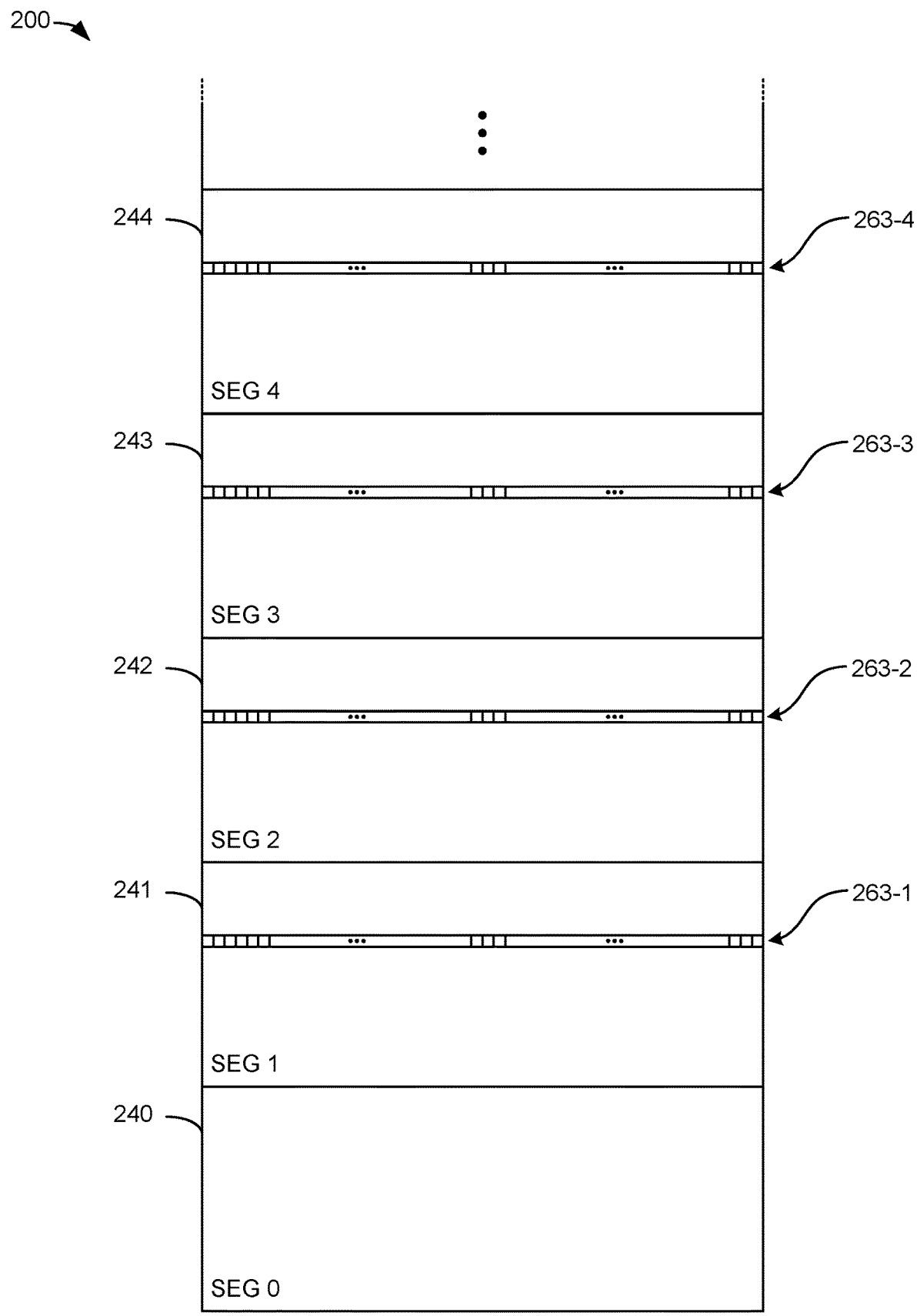

FIG. 2C illustrates an example multiple row refresh scheme where all of the refreshed rows are within different segments. In FIG. 2C, four row 263-1 to 263-4 are scheduled to be refreshed. Row 263-1 lies within segment 1 241. Row 263-2 lies within segment 2 242. Row 263-3 lies within segment 3 243. Row 263-4 lies within segment 4 244. None of segments 1-4 241-244 are refresh masked. Thus, when receiving a refresh command when rows 263-1 to 263-4 are scheduled to be refreshed, the memory component with memory bank 200 would require the nominal (i.e., full) $t_{RFC}$ amount of time before receiving a next subsequent command. Likewise, the controller issuing the refresh command would wait the nominal (i.e., full) $t_{RFC}$ amount of time before transmitting a next subsequent command.

Figure 2D:
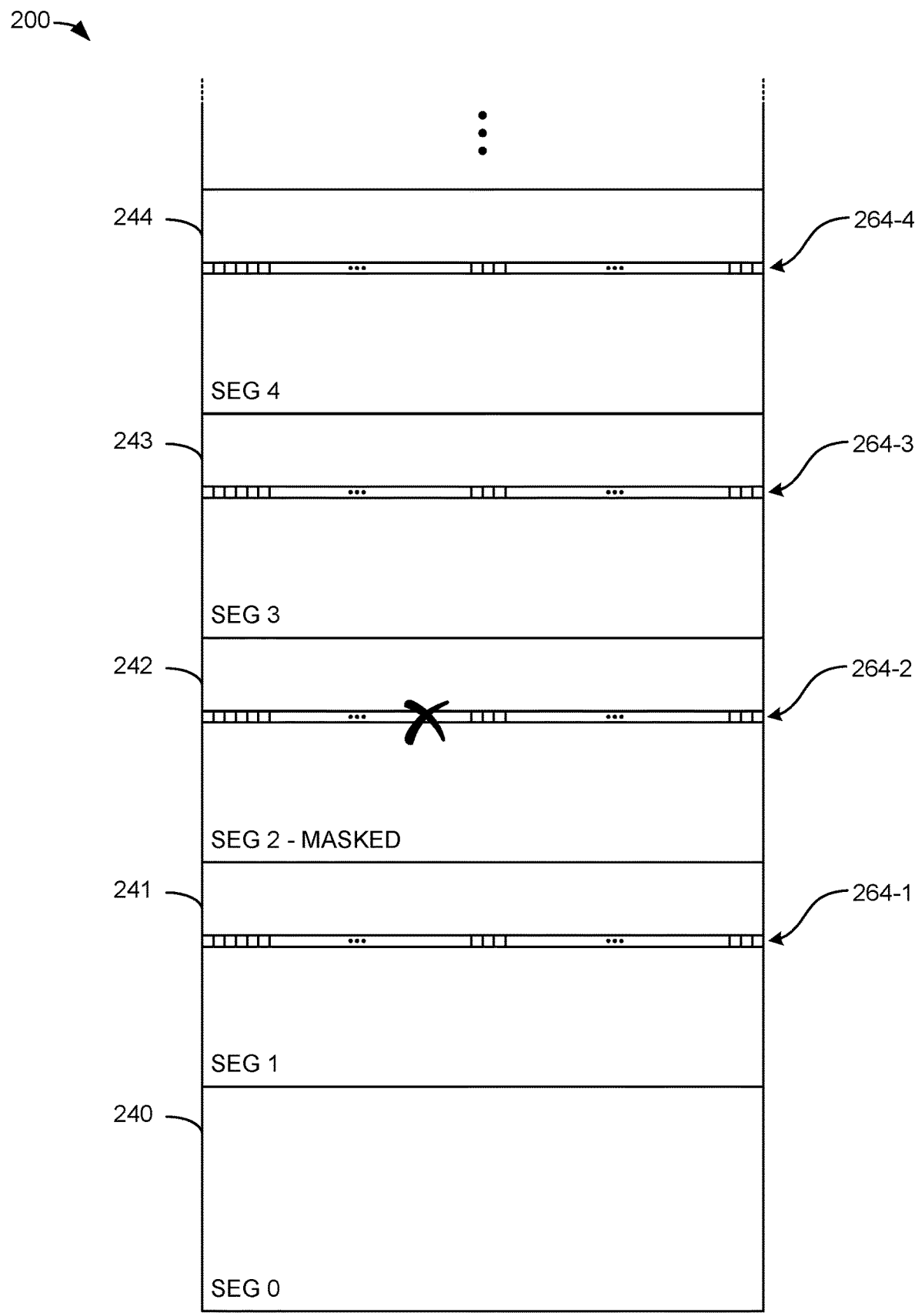

FIG. 2D illustrates the example multiple row refresh scheme of FIG. 2C (with all of the refreshed rows being within different segments) that targets one row in a masked segment. In FIG. 2D, four rows 264-1 to 264-4 are scheduled to be refreshed. Row 264-1 lies within segment 1 241. Row 264-2 lies within segment 2 242. Row 264-3 lies within segment 3 243. Row 264-4 lies within segment 4 244. Segment 2 242 is refresh masked. Segment 1 241, segment 3 243, and segment 4 244 are not refresh masked. Thus, row 264-1, row 264-3, and row 264-4 to be refreshed. Row 264-2 is not to be refreshed. This is illustrated in FIG. 2D by the X over row 264-2. Accordingly, when receiving a refresh command when rows 264-1 to 264-4 are scheduled to be refreshed, the memory component with memory bank 200 would require less than the nominal $t_{RFC}$ before receiving a next subsequent command. Likewise, the controller issuing the refresh command may only wait the reduced amount of time before transmitting a next subsequent command. For example, if four rows are refreshed when none of the rows lies within a refresh masked segment, the $t_{RFC}$ when one row is refresh masked may be calculated by:

$$t'_{RFC} = 3 \times t_{row} + t_{fixed}$$

where $t_{row}$ is the time to refresh a single row, and $t_{fixed}$ is a fixed time related to overhead operations (e.g., command decoding, etc.)

Figure 2E:
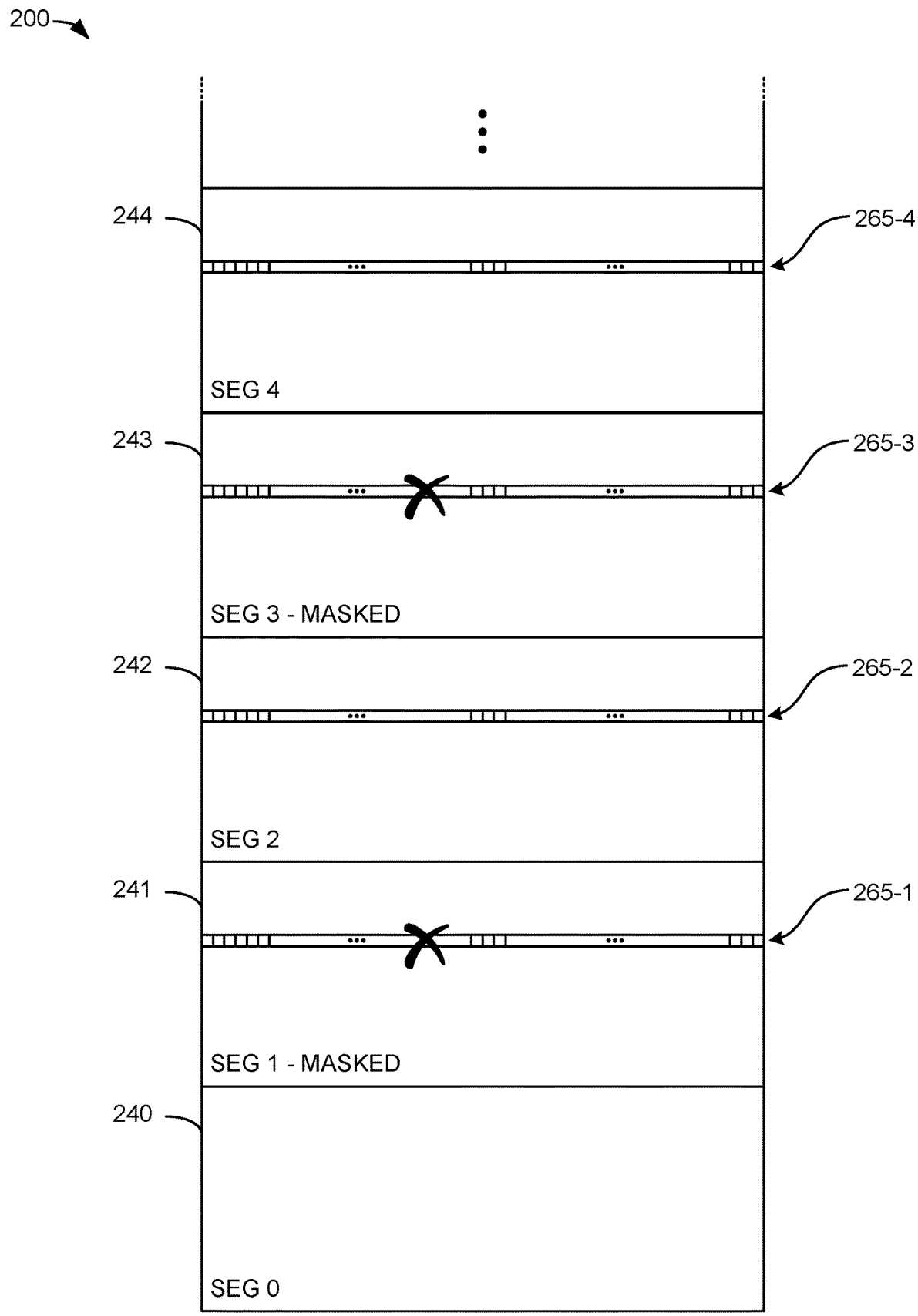

FIG. 2E illustrates the example multiple row refresh scheme of FIG. 2C (with all of the refreshed rows being within different same segments) that targets two rows in different masked segments. In FIG. 2E, four rows 265-1 to 265-4 are scheduled to be refreshed. Row 265-1 lies within segment 1 241. Row 265-2 lies within segment 2 242. Row 265-3 lies within segment 3 243. Row 265-4 lies within segment 4 244. Segment 1 241 and segment 3 243 are refresh masked. Segment 2 242 and segment 4 244 are not refresh masked. Thus, row 265-2 and row 265-4 are to be refreshed. Row 265-1 and row 265-3 are not to be refreshed. This is illustrated in FIG. 2E by the X's over row 265-1 and row 265-3. Accordingly, when receiving a refresh command when rows 265-1 to 265-4 are scheduled to be refreshed, the memory component with memory bank 200 would require less than the nominal $t_{RFC}$ before receiving a next subsequent command. Likewise, the controller issuing the refresh command may only wait the reduced amount of time before transmitting a next subsequent command. For example, if four rows are refreshed when none of the rows lies within a refresh masked segment, the $t_{RFC}$ when two rows are refresh masked may be calculated by:

$$t'_{RFC} = 3 \times t_{row} + t_{fixed}$$

where $t_{row}$ is the time to refresh a single row, and $t_{fixed}$ is a fixed time related to overhead operations (e.g., command decoding, etc.)

Figure 2F:
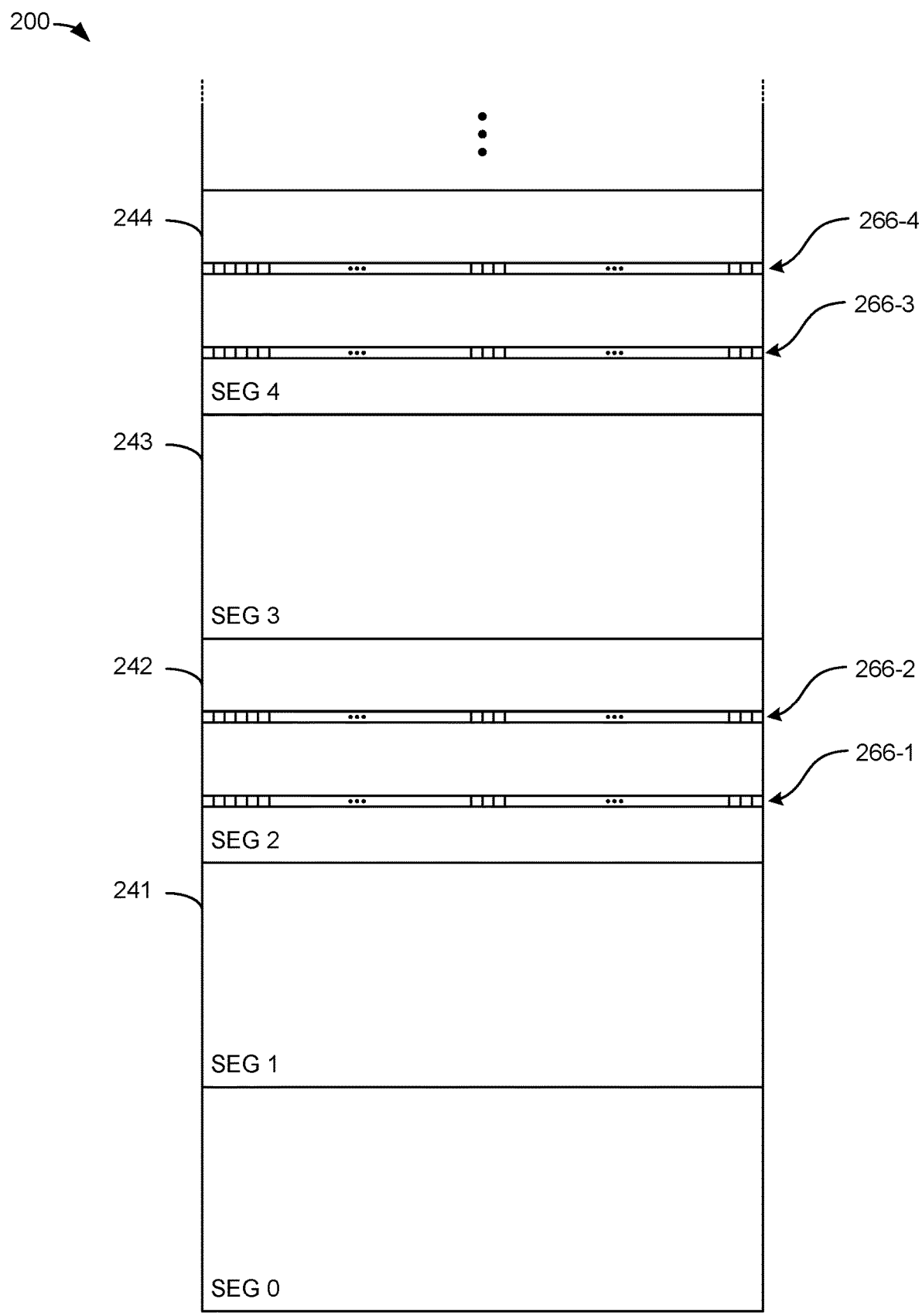

FIG. 2F illustrates an example multiple row refresh scheme where sets of the refreshed rows are within the same segment and multiple such segments are refreshed in response to a single refresh command. In FIG. 2F, four row 266-1 to 266-4 are to be refreshed. Row 266-1 and row 266-2 lie within segment 2 242. Row 266-3 and row 266-4 lie within segment 4 244. None of segments 1-4 241-244 are refresh masked. Thus, when receiving a refresh command when rows 266-1 to 266-4 are scheduled to be refreshed, the memory component with memory bank 200 would require the nominal (i.e., full) $t_{RFC}$ amount of time before receiving a next subsequent command. Likewise, the controller issuing the refresh command would wait the nominal (i.e., full) $t_{RFC}$ amount of time before transmitting a next subsequent command.

Figure 2G:
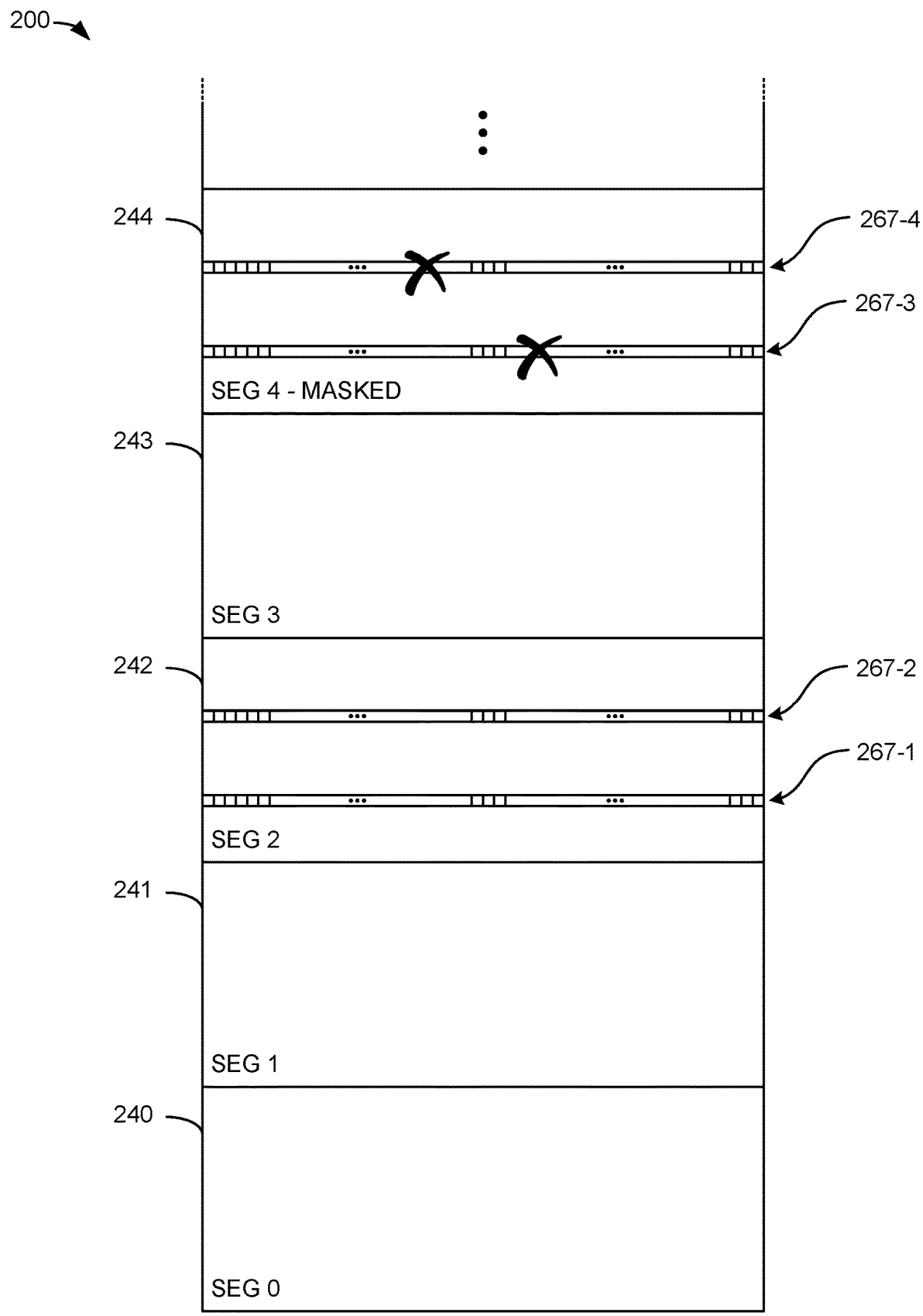

FIG. 2G illustrates the example multiple row refresh scheme of FIG. 2F (with sets of rows scheduled to be refreshed being within different segments) that targets two rows in the same masked segment. In FIG. 2G, four rows 267-1 to 267-4 are scheduled to be refreshed. Row 267-1 and row 267-2 lie within segment 2 242. Row 267-3 and row 267-4 lie within segment 4 244. Segment 4 244 is refresh masked. Segment 1 241, segment 2 242, and segment 3 243 are not refresh masked. Thus, row 267-1 and row 267-2 are to be refreshed. Row 267-3 and row 267-4 are not to be refreshed. This is illustrated in FIG. 2G by the X's over row 267-3 and row 267-4. Accordingly, when receiving a refresh command when rows 267-1 to 267-4 are scheduled to be refreshed, the memory component with memory bank 200 would require less than the nominal $t_{RFC}$ before receiving a next subsequent command. Likewise, the controller issuing the refresh command may only wait the reduced amount of time before transmitting a next subsequent command. For example, if four rows are refreshed when none of the rows lies within a refresh masked segment, the $t_{RFC}$ when two rows are refresh masked may be calculated by:

$$t'_{RFC} = 2 \times t_{row} + t_{fixed}$$

where $t_{row}$ is the time to refresh a single row, and $t_{fixed}$ is a fixed time related to overhead operations (e.g., command decoding, etc.)

Figure 3:
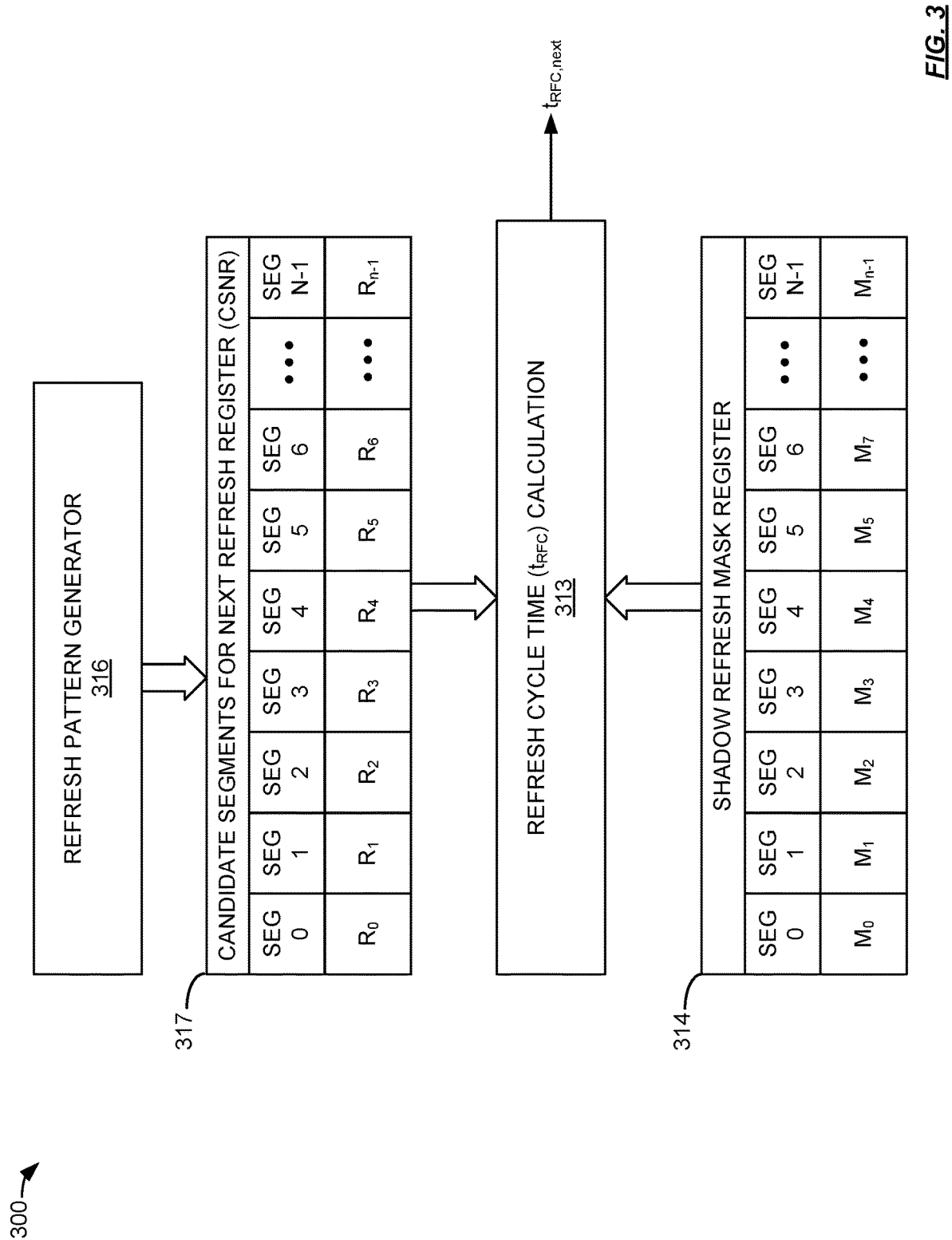
FIG. 3 is a diagram illustrating a refresh cycle time calculation system.

FIG. 3 is a diagram illustrating a refresh cycle time calculation system. In FIG. 3, refresh cycle time calculation system 300 comprises refresh cycle time calculation 313, shadow refresh mask register 314, refresh pattern generator 316, and candidate segments for next refresh register (CSNR) 317. Refresh cycle time calculation system 300 may be a part of, for example, controller 110, and refresh control 113 in particular.

Refresh pattern generator 316 provides CSNR 317 with indicators ($R_0$-$R_{n-1}$) that correspond to which segments have rows that are scheduled to be refreshed (and not refreshed) in response to the next refresh command. For example, if the next segments having one or more rows scheduled to be refreshed were segments 0, 2, and 4, then the indicators $R_0$, $R_2$, and $R_4$ would indicate a refresh is scheduled (e.g., with a logical '1') for those segments. Conversely, indicators $R_1$, $R_3$, and $R_5$ to $R_{n-1}$ would indicate (e.g., with a logical '0') that a refresh of those segments will not take place in response the next refresh command. When a refresh command is transmitted, refresh pattern generator 316 may update the indicators $R_0$-$R_{n-1}$ in CSNR 317 with new values that reflect which segments have rows that are scheduled to be refreshed (and not refreshed) in response to the next refresh command. For example, once the refresh command that refreshes rows in segments 0, 2, and 4 is transmitted, refresh pattern generator 316 may update $R_0$, $R_2$, and $R_4$ to indicate that a refresh of those segments will not take place in response the next refresh command, and update the indicators $R_1$, $R_3$, and $R_5$ to indicate a refresh is scheduled (e.g., with a logical '1') for those segments. The indicators $R_0$-$R_{n-1}$ maintained in CSNR 317 are provided to refresh cycle time calculation 313.

Shadow refresh mask register 314 is maintained (e.g., by controller 110) to hold indicators ($M_0$-$M_{n-1}$) that correspond to which segments are to be refreshed (e.g., with a logical '1') and which are not to be refreshed (e.g., with a logical '0'). The indicators $M_0$-$M_{n-1}$ maintained in shadow refresh mask register 314 are provided to refresh cycle time calculation 313.

Refresh cycle time calculation 313 receives the indicators $R_0$-$R_{n-1}$ of which segments are/are not scheduled to be refreshed in response to the next refresh command, and receives the indicators $M_0$-$M_{n-1}$ of which segments are/are not masked from being refreshed. Based on these two sets of indicators, refresh cycle time calculation 313 calculates a refresh cycle time for the next refresh command. Refresh cycle time calculation 313 may perform a bitwise logical AND of the two sets of indicators to generate a set of indicators $C_0$-$C_{n-1}$ that correspond to the segments that will be refreshed in response to the next refresh command (e.g., $C_0 = R_0 \cdot M_0$, $C_1 = R_1 \cdot M_1$, etc.) Based on the number of segments indicated by $C_0$-$C_{n-1}$ that are to be refreshed, refresh cycle time calculation may calculate the refresh cycle time for the next refresh command.

For example, let R be the number of segments scheduled to be refreshed as indicated by the contents of CSNR 317 (e.g., $R = \Sigma_{i=0}^{i=n-1} R_i$.) Let X be the number of segments that will be refreshed once the effects of refresh masking are included (i.e., the number of segments that will be refreshed as indicated by $C_0$-$C_{n-1}$—or, for example, $X = \Sigma_{i=0}^{i=n-1} C_i$.) If X is equal to R, then the cycle time for the next refresh command ($t_{RFC,next}$) is calculated to be the nominal (i.e., full) $t_{RFC}$ amount of time. If X is not equal to R, then $t_{RFC,next}$ is less than the nominal $t_{RFC}$. Table 1 illustrates an example calculation of $t_{RFC}$,next. The calculation of $t_{RFC,next}$ may be implemented by a lookup table to accommodate a more or less complicated (e.g., non-linear) relationship between the number of segments to be refreshed and the nominal $t_{RFC}$. If the relationship is a linear relationship without offset, then Table 1 may also be expressed as the equation:

$$t_{RFC,next} = \frac{X}{R} \times t_{RFC}$$

TABLE 1

Case(X) {
R: $t_{RFC,next} = t_{RFC}$ $R - 1: t_{RFC,next} = \frac{R-1}{R} \times t_{RFC}$ $R - 2: t_{RFC,next} = \frac{R-2}{R} \times t_{RFC}$ $R - 3: t_{RFC,next} = \frac{R-3}{R} \times t_{RFC}$ and so on.
}

Figure 4A:
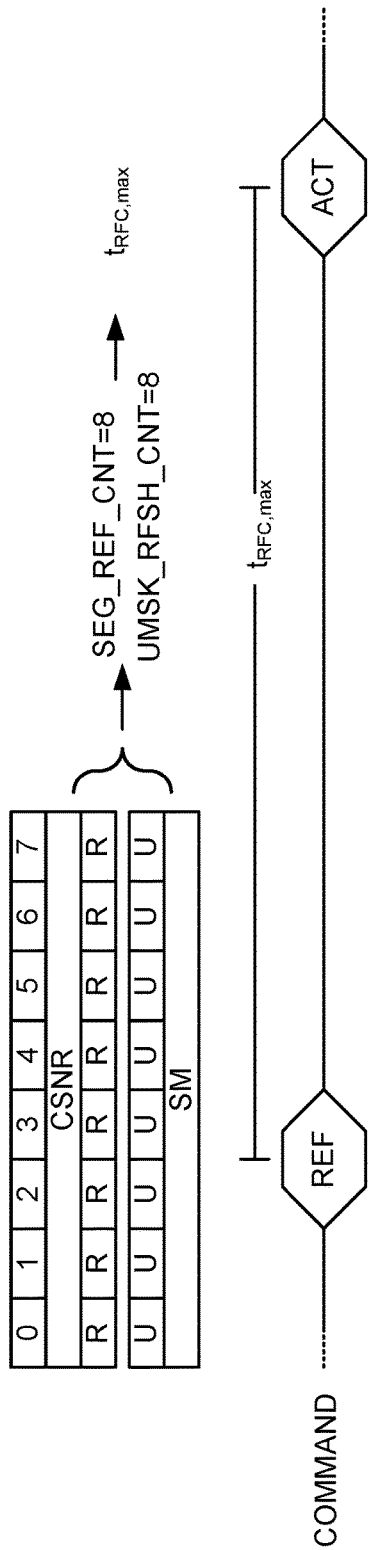
FIG. 4A-4C illustrate example masked array refresh cycle times.
Figure 4A:
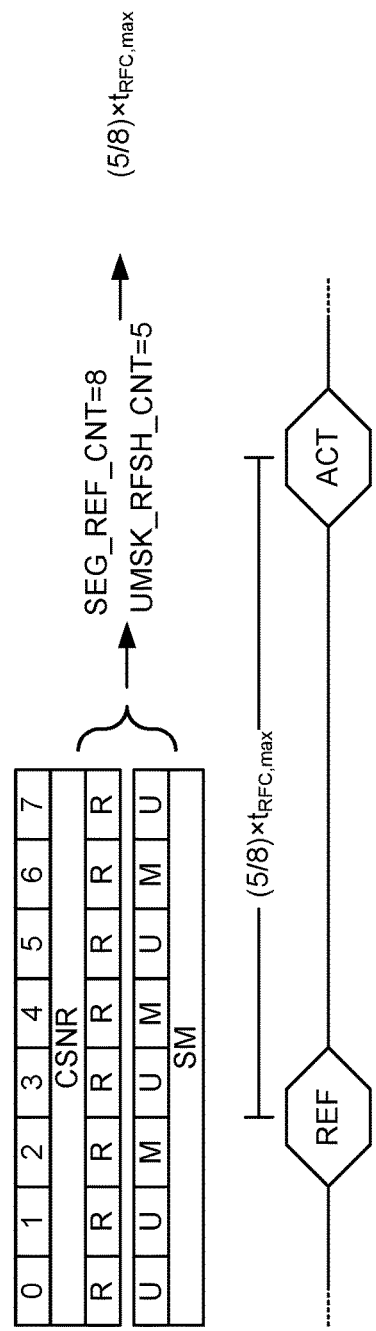
Figure 4B:
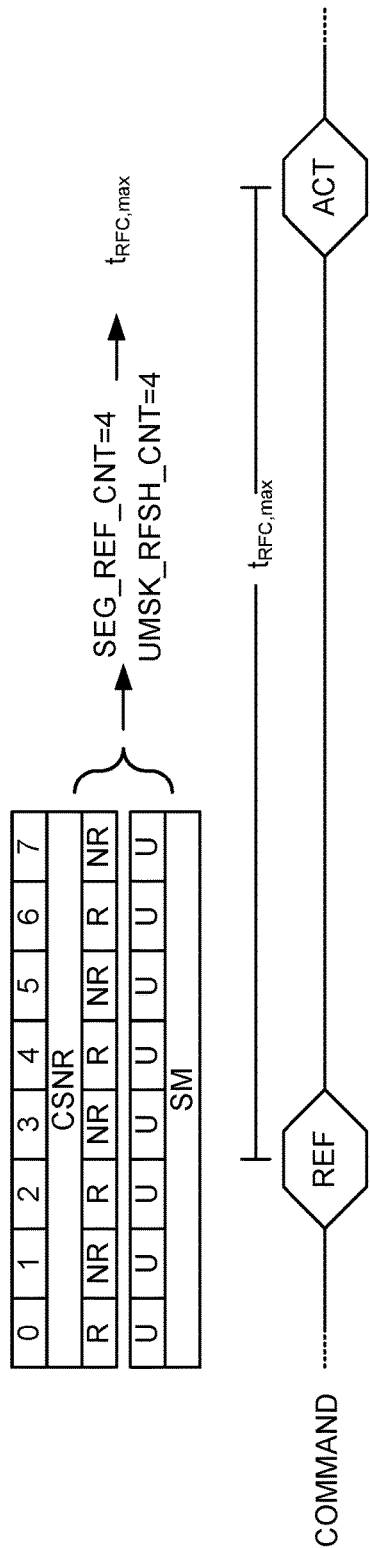
Figure 4B:
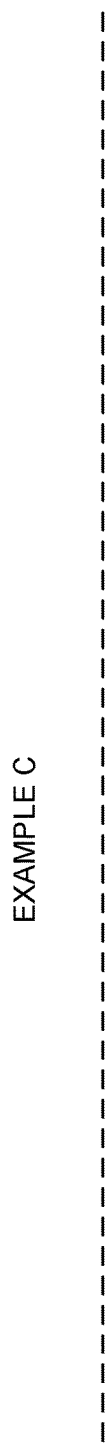
Figure 4B:
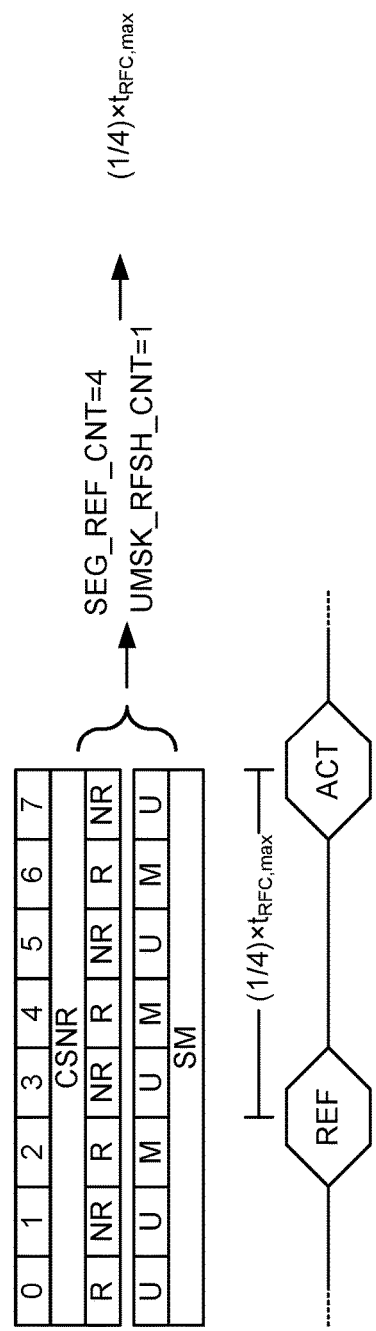
Figure 4C:
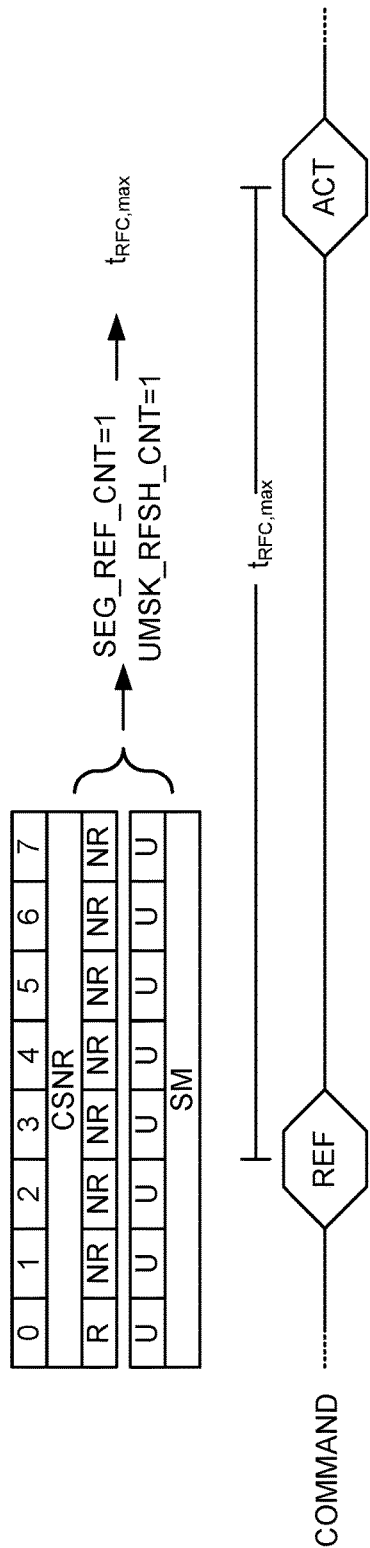
Figure 4C:
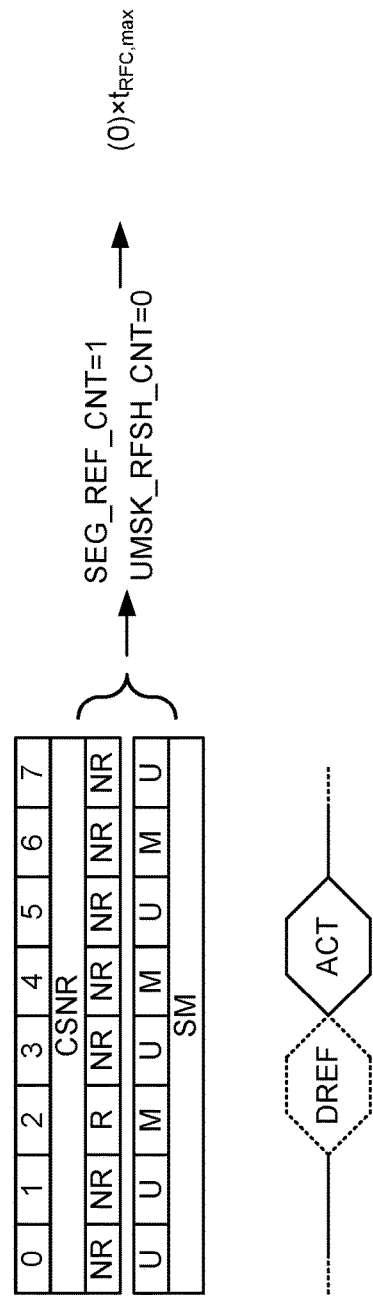

FIG. 4A-4C illustrate example masked array refresh cycle times. In particular, FIGS. 4A-4C illustrate example masked array refresh cycle times using the simple equations given as example in Table 1. In FIGS. 4A-4C, example indicator values for a CSNR and a shadow refresh mask register (SM) are illustrated. Indicators for eight (8) segments 0-7 are illustrated. For the CSNR, a "R" indicates the corresponding segment is scheduled to be refreshed and a "NR" indicates the corresponding segment is not scheduled to be refreshed. Similarly, for the SM register, a "U" indicates the segment is 'unmasked' and therefore will be refreshed, and a "M" indicates the segment is 'masked' and will not be refreshed.

In FIG. 4A, Example A and Example B are illustrated. In Example A, the value in CSNR indicates all eight segments are scheduled to be refreshed, and all eight segments are unmasked. This results in a CSNR segment refresh count of 8 segments, and an unmasked refresh count of 8 segments. Thus, Example A indicates that $t_{RFC}$ equals the nominal $t_{RFC}$ (a.k.a., $t_{RFC,max}$.) This is illustrated in Example A by the $t_{RFC,max}$ amount of time between a refresh (REF) command and an activate (ACT) command on a command bus.

In Example B, the value in CSNR indicates all eight segments are scheduled to be refreshed. The value in the SM register indicates segments 2, 4, and 6 are masked, and segments 0, 1, 3, 5, and 7 are unmasked. This results in a CSNR segment refresh count of 8 segments, and an unmasked refresh count of 5 segments. Thus, Example B indicates that $t_{RFC}$ equals ⅝ times $t_{RFC,max}$. This is illustrated in Example B by the (⅝)×$t_{RFC,max}$ amount of time between a refresh (REF) command and an activate (ACT) command on a command bus.

In FIG. 4B, Example C and Example D are illustrated. In Example C, the value in CSNR indicates segments 0, 2, 4, and 6 are scheduled to be refreshed, and segments 1, 3, 5, and 7 are not scheduled to be refreshed. The value in the SM register indicates all the segments are unmasked. This results in a CSNR segment refresh count of 4 segments, and an unmasked refresh count of 4. Thus, Example C indicates that $t_{RFC}$ equals $t_{RFC,max}$. This is illustrated in Example C by the $t_{RFC,max}$ amount of time between a refresh (REF) command and an activate (ACT) command on a command bus.

In Example D, the value in CSNR indicates segments 0, 2, 4, and 6 are scheduled to be refreshed, and segments 1, 3, 5, and 7 are not scheduled to be refreshed. The value in the SM register indicates segments 2, 4, and 6 are masked, and segments 0, 1, 3, 5, and 7 are unmasked. This results in a CSNR segment refresh count of 4 segments, and an unmasked refresh count of 1 segment. Thus, Example D indicates that $t_{RFC}$ equals ¼ times $t_{RFC,max}$. This is illustrated in Example D by the (¼) $t_{RFC,max}$ amount of time between a refresh (REF) command and an activate (ACT) command on a command bus.

In FIG. 4C, Example E and Example F are illustrated. In Example E, the value in CSNR indicates segment 0 is scheduled to be refreshed, and segments 1, 2, 3, 4, 5, 6, and 7 are not scheduled to be refreshed. The value in the SM register indicates all the segments are unmasked. This results in a CSNR segment refresh count of 1 segment, and an unmasked refresh count of 1. Thus, Example C indicates that $t_{RFC}$ equals $t_{RFC,max}$. This is illustrated in Example E by the $t_{RFC,max}$ amount of time between a refresh (REF) command and an activate (ACT) command on a command bus.

In Example F, the value in CSNR indicates the value in CSNR indicates segment 2 is scheduled to be refreshed, and segments 0, 1, 3, 4, 5, 6, and 7 are not scheduled to be refreshed. The value in the SM register indicates segments 2, 4, and 6 are masked, and segments 0, 1, 3, 5, and 7 are unmasked. This results in a CSNR segment refresh count of 1 segment, and an unmasked refresh count of 0 segments. Thus, Example F indicates that $t_{RFC}$ equals zero times $t_{RFC,max}$. This is illustrated in Example E by zero wait time between a refresh (REF) command and an activate (ACT) command on a command bus.

Figure 5:
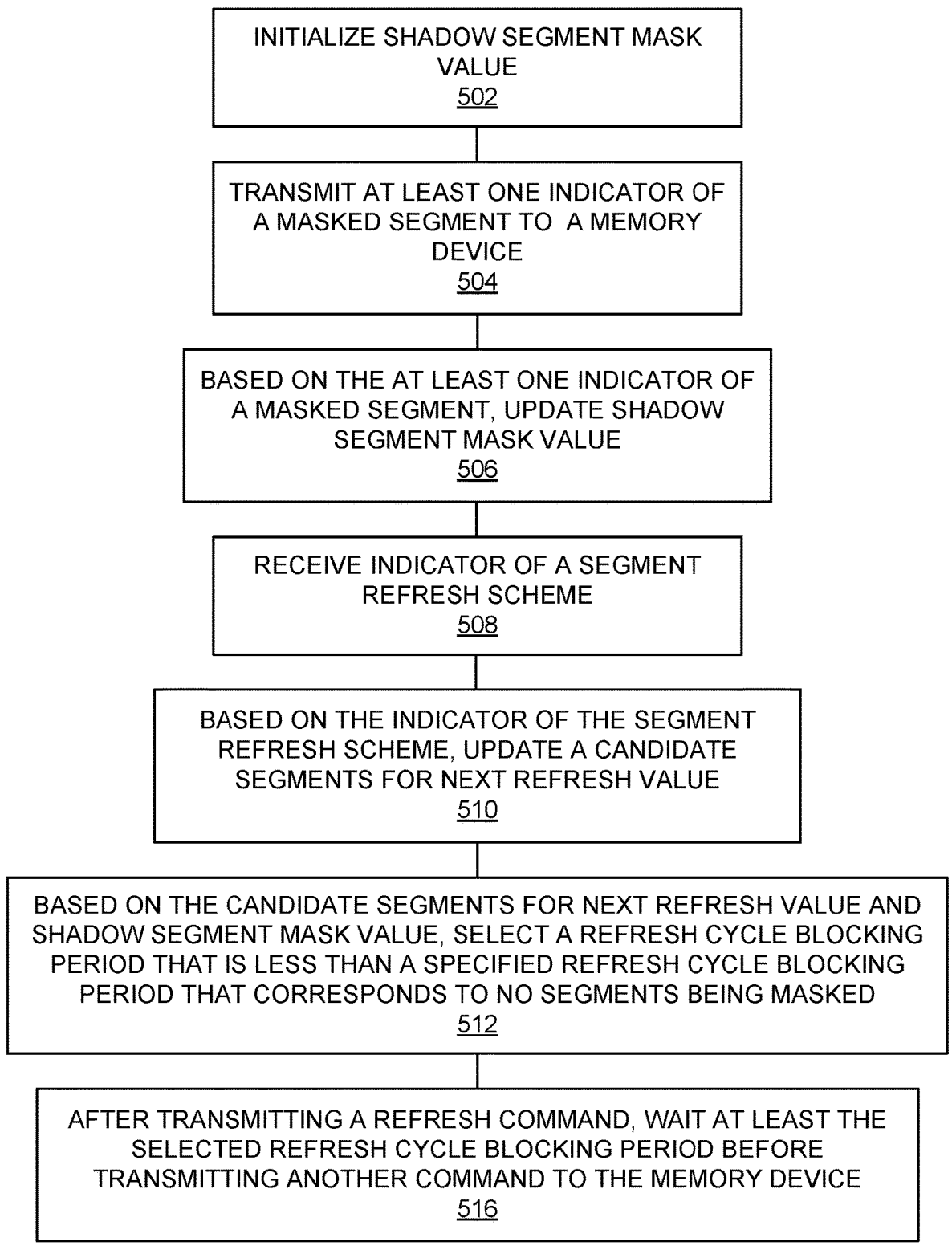
FIG. 5 is a flowchart illustrating a method of operating a memory controller when at least one segment is masked.

FIG. 5 is a flowchart illustrating a method of operating a memory controller when at least one segment is masked. Steps illustrated in FIG. 5 may be performed by one or more of memory system 100, refresh cycle time calculation system 300, and/or their components. A shadow segment value is initialized (502). For example, controller 110 may initialize shadow refresh mask register 114 to a value that corresponds to the power-up and/or reset value of refresh mask register 124. In another example, controller 110 may initialize shadow refresh mask register 114 to a value that corresponds to a value being written to refresh mask register 124 by controller 110.

At least one indicator of a masked segment is transmitted to a memory device (504). For example, controller 110 may transmit a value, to be written to refresh mask register 124, that indicates at least one segment is to be masked (i.e., not refreshed.) Controller 110 may use a mode register write command to transmit the value to be written to refresh mask register 124. Based on the at least one indicator of a masked segment, the shadow segment mask value is updated (506). For example, based on the transmitted value to be written to refresh mask register 124, controller 110 may update the value in shadow refresh mask register 114.

An indicator of a segment refresh scheme is received (508). For example, controller 110 may receive an indicator associated with a pattern of rows to be refreshed, and/or the pattern's progression for each refresh command. In an example, controller 110 may receive this indicator from a host system. In another example, controller 110 may query memory component 120 for the indicator. In another example, controller 110 may read a register of memory component 120 to receive an indicator of the segments that are scheduled to be refreshed in response to the next refresh command that is sent to memory component 120.

Based on the indicator of the segment refresh scheme, the candidate segments for next refresh value are updated (510). For example, based on the indicator associated with a pattern of rows to be refreshed and/or the pattern's progression for each refresh command, refresh pattern generator may update the value in CSNR 317. Based on the candidate segments for next refresh value, and the shadow segment mask value, select a refresh cycle blocking period that is less than a specified refresh cycle blocking period that corresponds to no segments being masked (512). For example, refresh cycle time calculation 313 may calculate a $t_{RFC,next}$ that is less than the nominal $t_{RFC,max}$ based on the value in CSNR 317 and the value in shadow refresh mask register 314.

After transmitting a refresh command, at least the selected refresh cycle blocking time is waited before transmitting another command to the memory device (516). For example, after transmitting a refresh command when at least on row in at least one masked segment is scheduled to be refreshed, controller 110 may wait the selected $t_{RFC,next}$, which is less than the nominal $t_{RFC,max}$, before transmitting another command to memory component 120.

Figure 6:
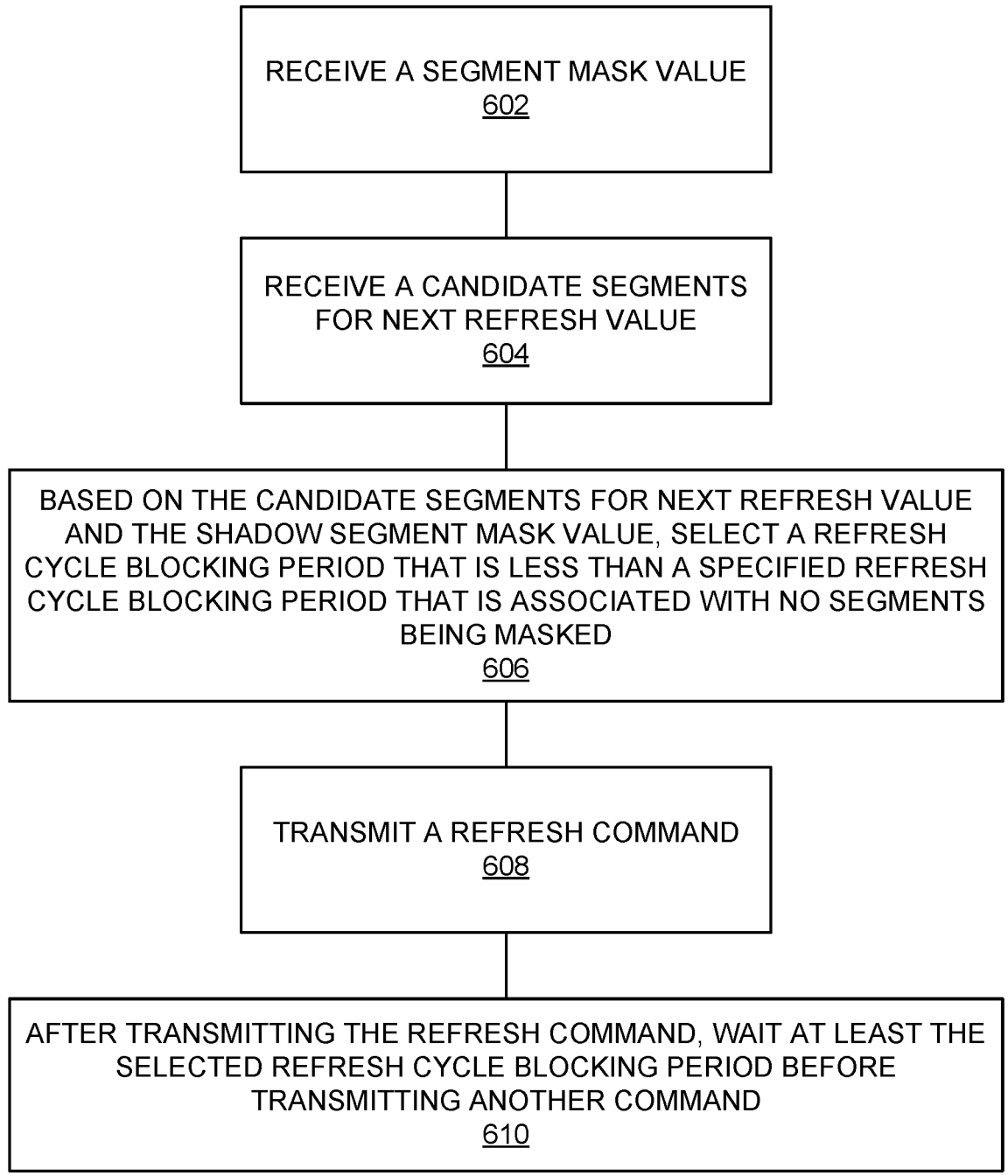
FIG. 6 is a flowchart illustrating a method of selecting a refresh cycle blocking period when at least one segment is masked.

FIG. 6 is a flowchart illustrating a method of selecting a refresh cycle blocking period when at least one segment is masked. Steps illustrated in FIG. 6 may be performed by one or more of memory system 100, refresh cycle time calculation system 300, and/or their components. A segment mask value is received (602). For example, controller 110 may receive a command to transmit a value to be written to refresh mask register 124. Based on the command, controller 110 may update the value in shadow refresh mask register 114.

A candidate segments for next refresh value is received (604). For example, based on a pattern of rows to be refreshed and the pattern's progression for each refresh command, and the location in the progression, refresh pattern generator 316 may set the value in CSNR 317. Based on the candidate segments for next refresh value and the shadow segment mask value, a refresh cycle blocking period is selected that is less than a specified refresh cycle blocking period that is associated with no segments being masked (606). For example, refresh cycle time calculation 313 may calculate a $t_{RFC}$,next that is less than the nominal $t_{RFC,max}$ based on the value in CSNR 317 and the value in shadow mask register 314.

A refresh command is transmitted (608). For example, controller 110 may transmit a refresh command to memory component 120. After transmitting the refresh command, at least the selected refresh cycle blocking period is waited before transmitting another command (610). For example, after transmitting a refresh command when at least one row in at least one masked segment is scheduled to be refreshed, controller 110 may wait the selected $t_{RFC}$,next, which is less than the nominal $t_{RFC,max}$, before transmitting another command to memory component 120.

Figure 7:
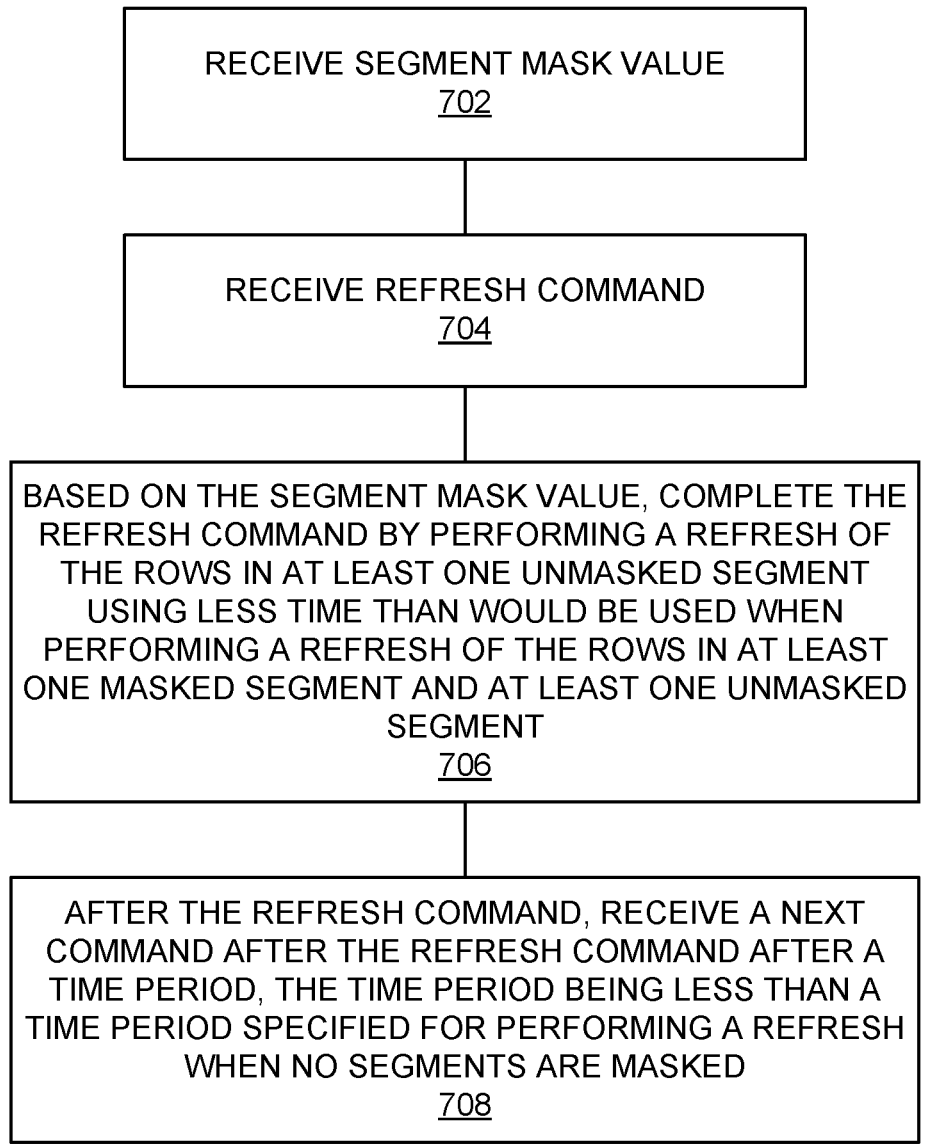
FIG. 7 is a flowchart illustrating a method of operating a memory component when at least one segment is masked.

FIG. 7 is a flowchart illustrating a method of operating a memory component when at least one segment is masked. Steps illustrated in FIG. 7 may be performed by one or more of memory system 100, refresh cycle time calculation system 300, and/or their components. A segment mask value is received (702). For example, controller 110 may transmit a command to memory component 120 to write a value to refresh mask register 124. Based on the command, memory component 120 may update the value in refresh mask register 124.

A refresh command is received (704). For example, controller 110 may transmit a refresh command to memory component 120 to cause memory component 120 to refresh multiple rows in response. Based on the segment mask value, complete the refresh command by performing a refresh of the rows in at least one unmasked segment using less time than would be used when performing a refresh of the rows in at least one masked segment and at least one unmasked segment (706). For example, based on a segment mask value blocking the refresh of at least one segment, memory component 120 may complete the multiple row refresh operation in less time than would be required to refresh all of the multiple rows scheduled to be refreshed.

After the refresh command, the next command after the refresh command is received after a time period where the time period is less than a time period specified for performing a refresh when no segments are masked (708). For example, memory component 120 may receive a next subsequent command after waiting a time period that is less than the nominal $t_{RFC,max}$.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, refresh cycle time calculation system 300, and/or their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 8:
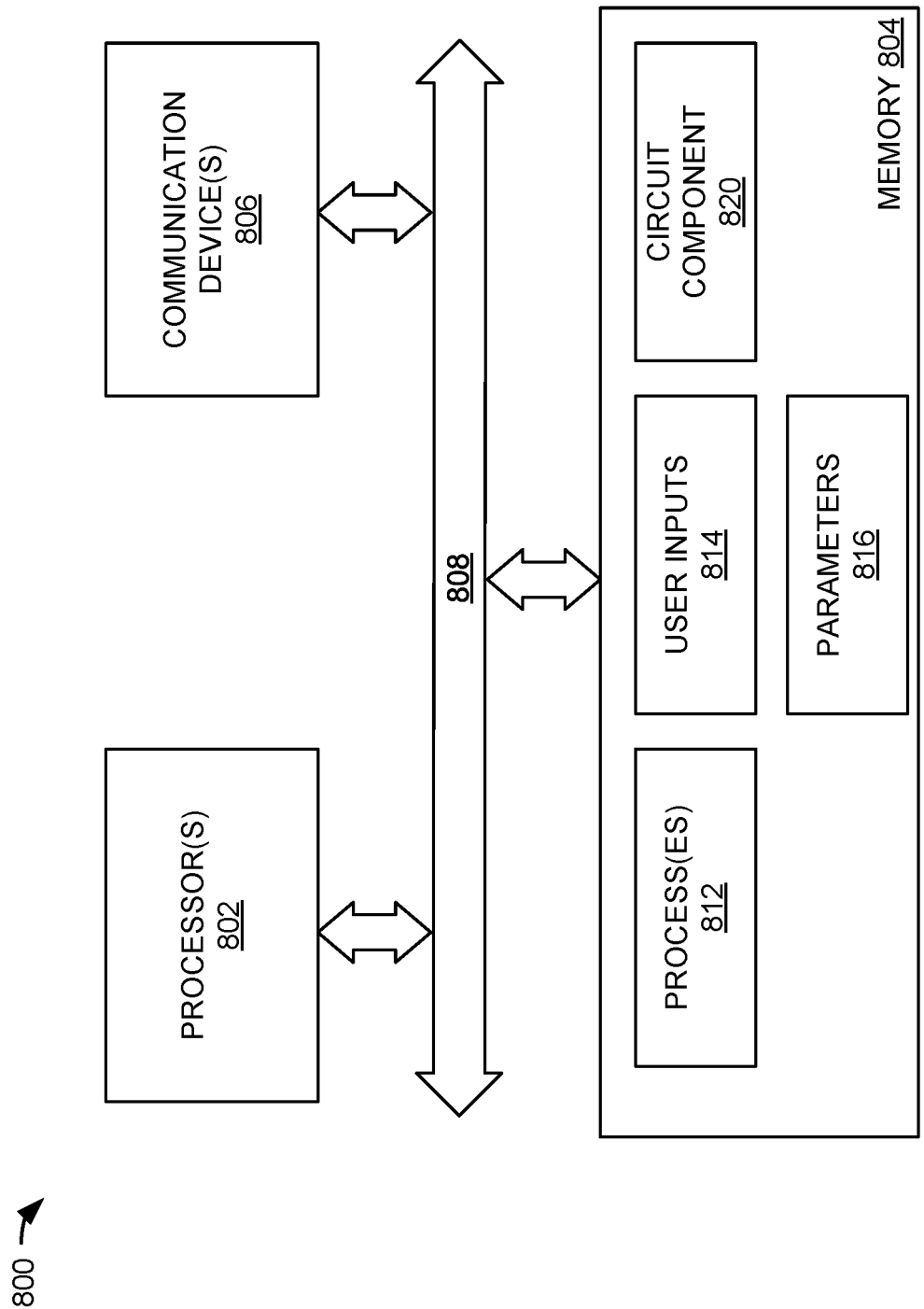
FIG. 8 is a block diagram of a processing system.

FIG. 8 is a block diagram illustrating one embodiment of a processing system 800 for including, processing, or generating, a representation of a circuit component 820. Processing system 800 includes one or more processors 802, a memory 804, and one or more communications devices 806. Processors 802, memory 804, and communications devices 806 communicate using any suitable type, number, and/or configuration of wired and/or wireless connections 808.

Processors 802 execute instructions of one or more processes 812 stored in a memory 804 to process and/or generate circuit component 820 responsive to user inputs 814 and parameters 816. Processes 812 may be any suitable electronic design automation (EDA) tool or portion thereof used to design, simulate, analyze, and/or verify electronic circuitry and/or generate photomasks for electronic circuitry. Representation 820 includes data that describes all or portions of memory system 100, refresh cycle time calculation system 300, and/or their components, as shown in the Figures.

Representation 820 may include one or more of behavioral, register transfer, logic component, transistor, and layout geometry-level descriptions. Moreover, representation 820 may be stored on storage media or communicated by carrier waves.

Data formats in which representation 820 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 814 may comprise input parameters from a keyboard, mouse, voice recognition interface, microphone and speakers, graphical display, touch screen, or other type of user interface device. This user interface may be distributed among multiple interface devices. Parameters 816 may include specifications and/or characteristics that are input to help define representation 820. For example, parameters 816 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 804 includes any suitable type, number, and/or configuration of non-transitory computer-readable storage media that stores processes 812, user inputs 814, parameters 816, and circuit component 820.

Communications devices 806 include any suitable type, number, and/or configuration of wired and/or wireless devices that transmit information from processing system 800 to another processing or storage system (not shown) and/or receive information from another processing or storage system (not shown). For example, communications devices 806 may transmit circuit component 820 to another system. Communications devices 806 may receive processes 812, user inputs 814, parameters 816, and/or circuit component 820 and cause processes 812, user inputs 814, parameters 816, and/or circuit component 820 to be stored in memory 804.

Implementations discussed herein include, but are not limited to, the following examples:

Example 1: A memory controller, comprising: a command interface to transmit at least a first refresh command and a first next subsequent command to a memory component; and, refresh control circuitry to, based at least on a first refresh masking configuration of the memory component and a first row refresh scheme of the memory component, select a first Row Refresh Cycle Timing ($t_{RFC}$) to determine a first time interval between a transmission of the first refresh command and the first next subsequent command.

Example 2: The memory controller of example 1, wherein the first $t_{RFC}$ is selected from a stored lookup table that is indexed based at least in part on the first refresh masking configuration.

Example 3: The memory controller of example 1, wherein the memory component is to provide the memory controller with a refresh masking indicator corresponding to the memory component using the first refresh masking configuration.

Example 4: The memory controller of example 1, wherein the command interface is to transmit a second refresh command and a second next subsequent command to the memory component, the refresh control circuitry to select a second $t_{RFC}$ based at least on a second refresh masking configuration of the memory component.

Example 5: The memory controller of example 4, wherein the refresh control circuitry is to select the second $t_{RFC}$ further based on a second row refresh scheme of the memory component.

Example 6: The memory controller of example 4, wherein the memory component is configured to reliably operate when refreshed using a specified number of refresh commands over a specified refresh interval time period, the specified number of refresh commands and the specified refresh interval time period being used when the memory component is configured with the first refresh masking configuration and when the memory component is configured with the second refresh masking configuration.

Example 7: The memory controller of example 4, wherein the second refresh masking configuration corresponds to the memory component operating at a specified full capacity of memory space and the first refresh masking configuration correspond to the memory component disabling at least a portion of the specified full capacity of memory space, the first $t_{RFC}$ to be a shorter time interval than the second $t_{RFC}$.

Example 8: A memory controller, comprising: a command interface configured to be coupled to at least one memory component, the command interface to transmit, to the at least one memory component, a first indicator to place the at least one memory component in at least a first partial array refresh mode and a second partial array refresh mode; an access command generator to produce memory access commands to be transmitted to the at least one memory component via the command interface; and, refresh control circuitry to, based at least in part on the first partial array refresh mode, select a first minimum time interval between a first transmission of a first one of a series of refresh commands and a second transmission of a first next subsequent memory access command.

Example 9: The memory controller of example 8, wherein the refresh control circuitry is to, based at least in part on the second partial array refresh mode, select a second minimum time interval between a third transmission of a second one of the series of refresh commands and a fourth transmission of a second next subsequent memory access command.

Example 10: The memory controller of example 9, wherein the first partial array refresh mode corresponds to the at least one memory component operating at a specified full capacity of memory space, the second partial array refresh mode corresponds to the at least one memory component operating at less than the specified full capacity of memory space, and the second minimum time interval is less than the first minimum time interval.

Example 11: The memory controller of example 10, wherein an indicator of the second minimum time interval is provided by a lookup table that is indexed based at least in part on the second partial array refresh mode.

Example 12: The memory controller of example 10, wherein the at least one memory component is configured to reliably operate when refreshed using a specified number of refresh commands over a specified refresh interval time period, the specified number of refresh commands and the specified refresh interval time period being used when the memory component is in the first partial array refresh mode and when the memory component is in the second partial array refresh mode.

Example 13: The memory controller of example 8, wherein the at least one memory component provides at least one refresh masking indicator to the memory controller.

Example 14: The memory controller of example 13, wherein a first refresh masking indicator is associated with a first scheme of memory rows to be refreshed in response to a single one of the series of refresh commands.

Example 15: The memory controller of example 14, wherein the at least one memory component is to reliably operate, at a specified full capacity of memory space, when refreshed using a first specified number of refresh commands over a specified refresh interval time period, and the at least one memory component is to reliably operate, at less than the specified full capacity of memory space, when refreshed using a second specified number of refresh commands over the specified refresh interval time period, the second specified number of refresh commands over the specified refresh interval time period to be used when the memory component is in the second partial array refresh mode.

Example 16: A method of operating a memory system, comprising: configuring a memory component in a first array refresh mode; while the memory component is in the first array refresh mode, transmitting, to the memory component, a first refresh command; based at least in part on the memory component being in the first array refresh mode, waiting a first minimum time interval before allowing a first memory access command to be transmitted to the memory component; configuring the memory component in a second array refresh mode; while the memory component is in the second array refresh mode, transmitting, to the memory component, a second refresh command; and, based at least in part on the memory component being in the second array refresh mode, waiting a second minimum time interval before allowing a second memory access command to be transmitted to the memory component, the first minimum time interval and the second minimum time interval being unequal.

Example 17: The method of example 16, wherein the first array refresh mode determines a first number of memory rows to be refreshed in response to the first refresh command, the second array refresh mode determines a second number of memory rows to be refreshed in response to the second refresh command, the first number of memory rows being different from the second number of memory rows.

Example 18: The method of example 17, wherein the second number of memory rows is less than the first number of memory rows and, based on the second number of memory rows being less than the first number of memory rows, selecting the second minimum time interval to be less than the first minimum time interval.

Example 19: The method of example 17, further comprising: receiving, from the memory component, a first indicator of the first number of memory rows to be refreshed in response to refresh commands received by the memory component when the memory component is in the first array refresh mode.

Example 20: The method of example 19, further comprising: receiving, from the memory component, a second indicator of the second number of memory rows to be refreshed in response to refresh commands received by the memory component when the memory component is in the second array refresh mode.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory controller, comprising:
    a command interface to couple to a memory component that includes a refresh masking register;
    a shadow refresh masking register to store values corresponding to values currently stored by the refresh masking register of the memory component;
    the command interface to transmit a first indicator of a first masked segment to the memory component;
    shadow refresh masking register updating circuitry to, based on an indicator of the first masked segment, update the shadow refresh masking register to indicate a first masked segments value that indicates the first masked segment will not be refreshed by the memory component in response to a next refresh command transmitted via the command interface; and
    command timing control circuitry to, based on the first masked segments value, select a first minimum required time interval between a first transmission, via the command interface, of the next refresh command and a second transmission, via the command interface, of a next subsequent non-refresh memory access command.

2. The memory controller of claim 1, further comprising:
    circuitry to indicate a set of candidate segments for the next refresh command.

3. The memory controller of claim 2, wherein the first minimum required time interval is further based on the set of candidate segments for the next refresh command.

4. The memory controller of claim 3, further comprising:
    circuitry to indicate, based on the set of candidate segments for the next refresh command, a first set of rows to be refreshed, and a second set of rows to not be refreshed, by the next refresh command.

5. The memory controller of claim 4, wherein the first set of rows and the second set of rows is based on an indicator associated with a pattern of rows to be refreshed.

6. The memory controller of claim 4, wherein the first set of rows and the second set of rows is base is associated with a progression of a pattern of rows to be refreshed.

7. The memory controller of claim 4, wherein an indicator of the first set of rows and the second set of rows is provided by the memory component.

8. A memory controller, comprising:
    a command interface to couple to a memory component that includes a refresh masking register;
    the command interface to transmit a first indicator of a first masked segment to the memory component;
    circuitry to, based on an indicator associated with a pattern of rows to be refreshed, indicate a first set of rows to be refreshed, and a second set of rows to not be refreshed, by a next refresh command;
    circuitry to, based on the first set of rows and the second set of rows, indicate a set of candidate segments for the next refresh command; and
    command timing control circuitry to, based on the set of candidate segments and the first masked segment, select a first minimum required time interval between a first transmission, via the command interface, of the next refresh command and a second transmission, via the command interface, of a next subsequent memory access command.

9. The memory controller of claim 8, wherein the first set of rows and the second set of rows is based on an indicator associated with a pattern of rows to be refreshed.

10. The memory controller of claim 8, wherein an indicator of the first set of rows and the second set of rows is provided by the memory component.

11. The memory controller of claim 8, wherein the first set of rows and the second set of rows is based on a progression of a pattern of rows to be refreshed.

12. The memory controller of claim 11, wherein a location in the progression of the pattern of rows to be refreshed is provided by the memory component.

13. The memory controller of claim 8, further comprising:
a shadow refresh masking register.

14. The memory controller of claim 13, further comprising:
shadow refresh masking register updating circuitry to, based on an indicator of the first masked segment, update the shadow refresh masking register to indicate a first masked segments value.

15. The memory controller of claim 14, wherein the command timing control circuitry is to, based further on the first masked segments value, select the first minimum required time interval.

16. A method of operating a memory controller, comprising:
transmitting, to a memory component, a first indicator of a first segment that is not to be refreshed by the memory component, the first indicator to set a first masked segments value stored by a refresh mask register of the memory component;
updating a shadow refresh masking register of the memory controller to indicate the first masked segments value that indicates the first segment will not be refreshed by the memory component;
based on the first masked segments value, selecting a first minimum required time interval between a first transmission, via a command interface coupled with the memory component, of a next refresh command and a second transmission, via the command interface, of a next subsequent non-refresh access command to be transmitted via the command interface;
transmitting the next refresh command via the command interface; and
after at least the first minimum required time interval from transmission of the next refresh command via the command interface, transmitting the next subsequent non-refresh access command via the command interface.

17. The method of claim 16, further comprising:
determining a set of candidate segments for the next refresh command.

18. The method of claim 17, further comprising:
based on the set of candidate segments, determining a first set of rows of the memory component that are to be refreshed by the next refresh command; and
based on the set of candidate segments, determining a second set of rows of the memory component that are not to be refreshed by the next refresh command.

19. The method of claim 18, further comprising:
receiving an indicator of a pattern of rows to be refreshed, wherein the first set of rows and the second set of rows is based on the pattern.

20. The method of claim 19, further comprising:
receiving an indicator of a location in the pattern of rows to be refreshed, wherein the first set of rows and the second set of rows is further based on the location in the pattern of rows.

* * * * *